United States Patent [19]

Izu et al.

[11] Patent Number: 4,485,125

[45] Date of Patent: Nov. 27, 1984

[54] METHOD FOR CONTINUOUSLY PRODUCING TANDEM AMORPHOUS PHOTOVOLTAIC CELLS

[75] Inventors: Masatsugu Izu, Birmingham; Herbert C. Ovshinsky, Oak Park, both of Mich.

[73] Assignee: Energy Conversion Devices, Inc., Troy, Mich.

[21] Appl. No.: 460,629

[22] Filed: Jan. 24, 1983

Related U.S. Application Data

[63] Continuation-in-part of Ser. No. 359,825, Mar. 19, 1982.

[51] Int. Cl.³ .............................................. C23C 13/02
[52] U.S. Cl. ........................................ 427/74; 427/85; 427/39; 427/87; 427/255.5; 427/255.2; 427/255.7
[58] Field of Search .................. 427/74, 86, 87, 38, 427/39, 255.5, 255.7, 255.2, 255.1; 118/718, 723, 45, 719, 733, 50.1, 729; 242/67.3 R; 226/92

[56] References Cited

U.S. PATENT DOCUMENTS

| | | | |
|---|---|---|---|
| 2,862,705 | 12/1958 | Faeber | 226/92 |
| 3,083,926 | 4/1963 | Herr | 242/67.3 R |
| 4,015,558 | 4/1977 | Small et al. | 118/719 X |
| 4,379,943 | 4/1983 | Yang et al. | 427/39 X |
| 4,410,558 | 10/1983 | Izu et al. | 427/74 X |
| 4,438,723 | 3/1984 | Cannella et al. | 118/719 X |

*Primary Examiner*—John D. Smith
*Assistant Examiner*—Bernard F. Plantz
*Attorney, Agent, or Firm*—Marvin S. Siskind; Ronald W. Citkowski

[57] ABSTRACT

A method and a multiple chamber apparatus for the continuous production of tandem, amorphous, photovoltaic cells on substrate material, whereby, at least six amorphous semiconductor layers are continuously and sequentially deposited on the substrate material under steady state conditions. The substrate material is driven from a supply core, through at least two triads of deposition chambers, to a take-up core. Each amorphous layer of each p-i-n-type cell is produced in one chamber of the triad of deposition chambers. In the first chamber of each triad of chambers, a dopant gas mixture is introduced to deposit a first conductive semiconductor layer atop the substrate. In the second chamber of each triad of chambers, a gas mixture is introduced to deposit an intrinsic layer atop the first layer. And in the third chamber of each triad of chambers, a dopant gas mixture is introduced to deposit a second conductive layer, opposite in conductivity from the first conductive layer, atop the intrinsic layer. The multiple chamber apparatus is constructed to substantially prevent (1) the dopant gases in the first or third chamber of each triad from contaminating the intrinsic gases in the second chamber of each triad of deposition chambers; and (2) the dopant gases in the third chamber of a preceding triad of deposition chambers and the dopant gases in the first chamber of a succeeding triad of deposition chambers from cross-contamination. In the preferred embodiment, the intrinsic material is an amorphous silicon alloy which is doped by boron to form a p-type alloy and doped by phosphorous to form an n-type alloy. The preferred embodiment further contemplates the use of a glow discharge deposition process wherein vacuum pressure conditions, temperature levels, reaction gas mixtures, reaction gas flow rates, cathode power generation levels, substrate speed of travel, and substrate tension are precisely controlled.

2 Claims, 21 Drawing Figures

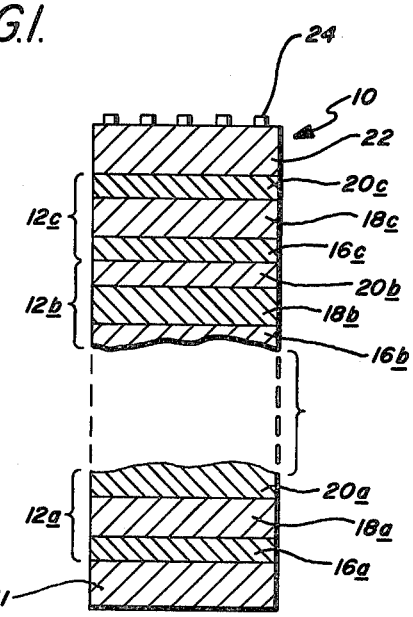
FIG.1.
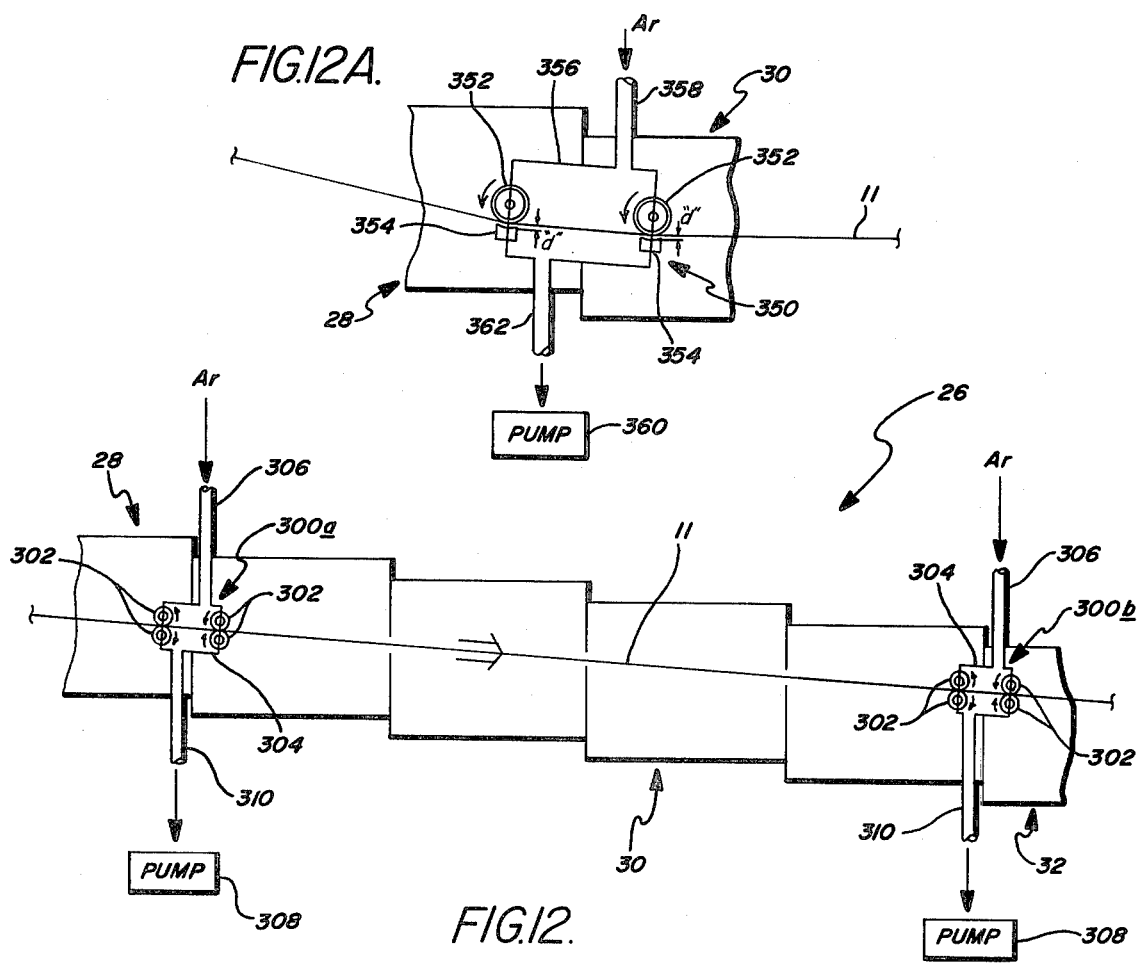
FIG.12A.
FIG.12.

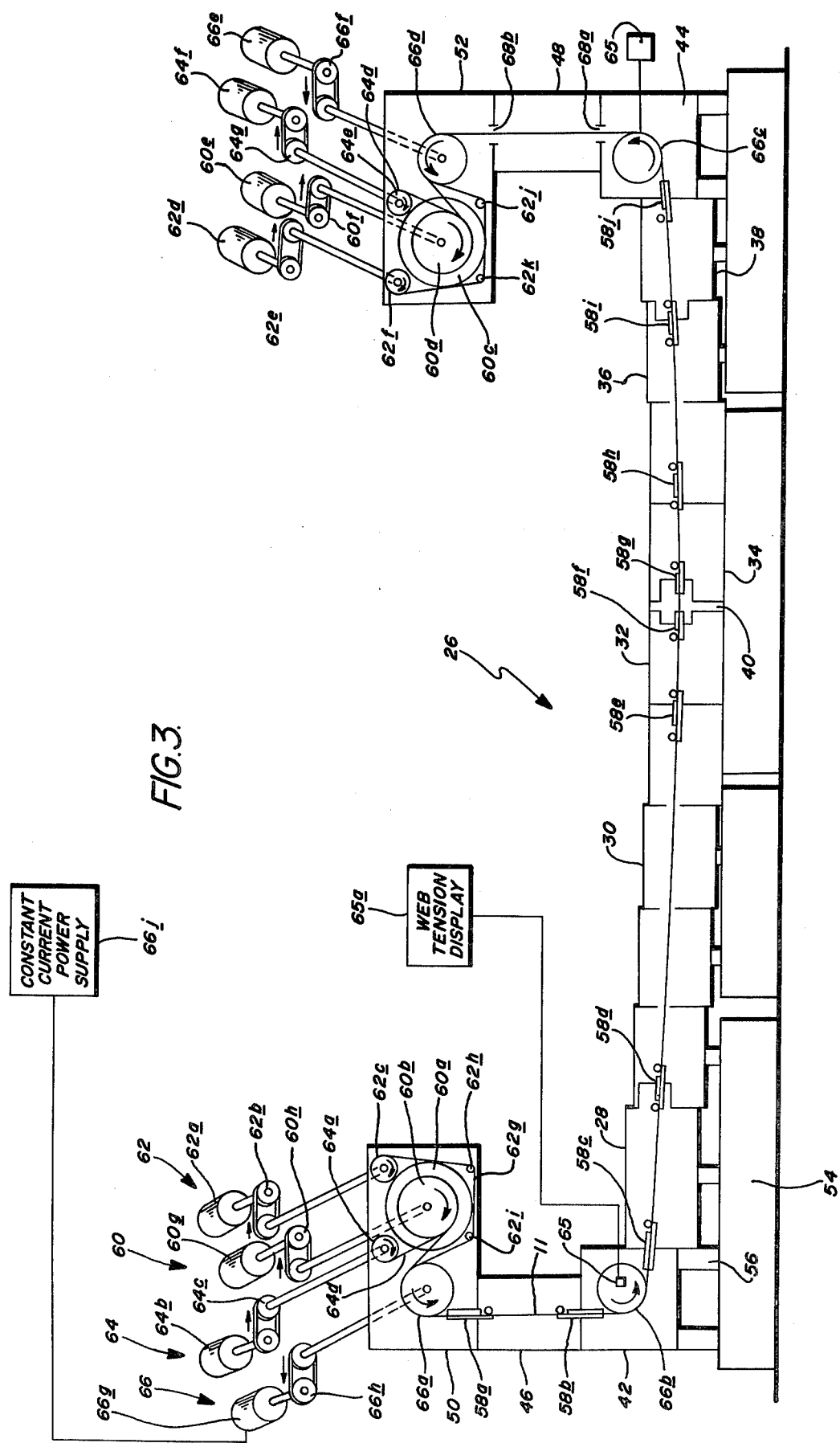

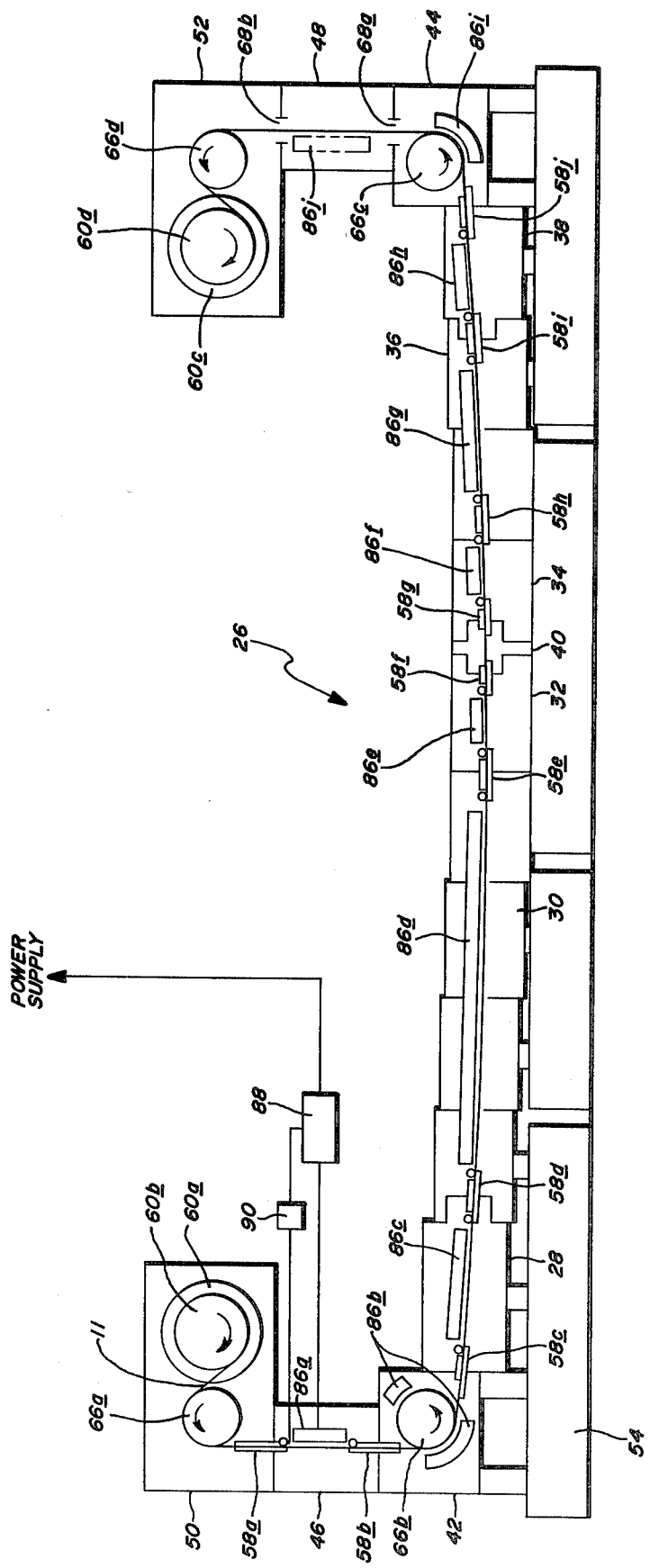

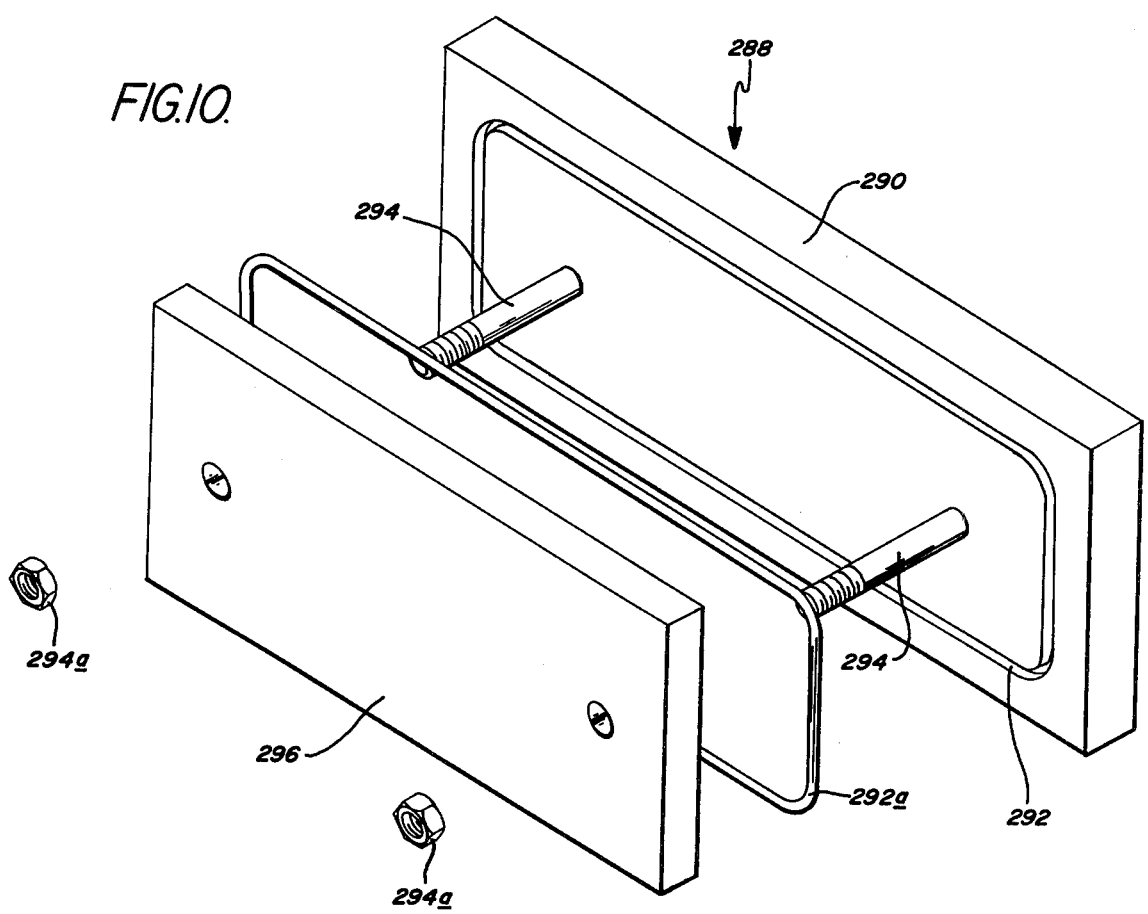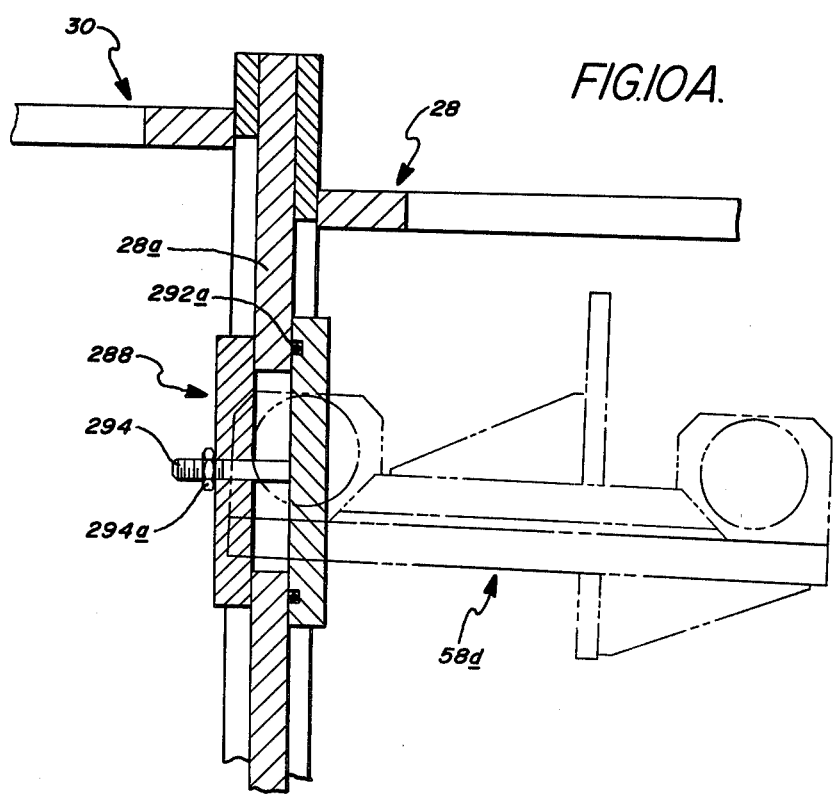

METHOD FOR CONTINUOUSLY PRODUCING TANDEM AMORPHOUS PHOTOVOLTAIC CELLS

CROSS-REFERENCE TO RELATED APPLICATION

This is a continuation-in-part application of U.S. patent application Ser. No. 359,825 filed Mar. 19, 1982.

FIELD OF THE INVENTION

The present invention relates generally to methods and apparatus for producing photovoltaic devices and more particularly to a method and apparatus for the high volume production of tandem p-i-n-type photovoltaic cells by depositing successive layers of amorphous semiconductor alloys onto substrate material as the substrate material is continuously and sequentially advanced through a plurality of dedicated deposition chambers.

BACKGROUND OF THE INVENTION

This invention relates to a method and apparatus for producing photovoltaic cells by depositing layers of amorphous semiconductor materials of varying electrical conductivity onto a web of substrate material as the substrate material is continuously advanced through a series of dedicated deposition chambers. The deposition of each layer occurs in a separate glow discharge deposition chamber wherein isolation of preselected reaction gas mixtures which form the amorphous semiconductor layers substantially eliminates cross-contamination between adjacent chambers. The substrate is preferably formed of stainless steel and is adapted to be fed sequentially and continuously through the dedicated chambers to have deposited thereon two or more band gap-adjusted, amorphous, photoresponsive cells such as a plurality of p-i-n-type photovoltaic cells. This invention has its most important application in the mass production of tandem band gap adjusted, amorphous semiconductor, photoresponsive, high efficiency solar cells.

Recently, considerable efforts have been made to develop processes for depositing amorphous semiconductor films, each of which can encompass relatively large areas, and which can be doped to form p-type and n-type materials for the production of p-i-n-type devices substantially equivalent to those produced by their crystalline counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films wherein silane ($SiH_4$) gas is passed through a reaction tube where the gas is decomposed by a; radio frequency (r.f.) glow discharge and deposited on a substrate at a substrate temperature of about 500–600 degrees K. (227–327 degrees C.). The material so deposited on the substrate is an intrinsic amorphous material consisting of silicon and hydrogen. To produce a doped amorphous material, phosphine gas ($PH_3$), for n-type conduction, or diborane ($B_2H_6$) gas, for p-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare greatly improved amorphous silicon alloys, that have significantly reduced concentrations of localized states in the energy gaps thereof, while providing high quality electronic properties by glow discharge. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, it is believed that fluorine introduced into the amorphous silicon semiconductor operates to substantially reduce the density of the localized states therein and facilitates the addition of other alloying materials, such as germanium.

Activated fluorine is believed to readily diffuse into, and bond to, amorphous silicon in a matrix body to substantially decrease the density of localized defect states therein. This is thought to be due to the fact that the small size of the fluorine atoms enables them to be readily introduced into an amorphous silicon matrix. The fluorine therefore bonds to the dangling bonds of the silicon and forms a partially ionic stable bond with flexible bonding angles, which results in a more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and having highest electronegativity.

Compensation may be achieved with fluorine, alone or in combination with hydrogen, upon the addition of such element(s) in very small quantities (e.g., fractions of one atomic percent). However, the amounts of fluorine and hydrogen most desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defect states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is believed to (1) be an organizer of local structure in the silicon-containing alloy through inductive and ionic effects, and also (2) influence the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant.

Many publications on crystalline stacked cells following Jackson have been reported and, recently, several articles dealing with Si-H materials in stacked cells have been published. Marfaing proposed utilizing silane deposited amorphous Si-Ge alloys in stacked cells, but did not report the feasibility of doing so. (Y. Marfaing, Proc. 2nd European) Communities Photovoltaic Solar Energy Conf., Berlin, West Germany, p. 287, (1979).

Hamakawa et al, reported the feasibility of utilizing Si-H in a configuration which will be defined herein as a cascade type multiple cell. The cascade cell is hereinafter referred to as a multiple cell without a separation or insulating layer there between. Each of the cells was made of an Si-H material of the same band gap as in a p-i-n junction configuration. Matching of the short circuit current ($J_{sc}$) was attempted by increasing the thickness of the cells in the serial light path. As expected, the overall device Voc increased and was proportional to the number of cells.

In a recent report on increasing the cell efficiency of multiple-junction (stacked) photovoltaic cells of amorphous silicon deposited from silane in the above manner, it was reported that "(g)ermanium has been found to be a deleterious impurity in Si:H, lowering its $J_{sc}$ exponentially with increasing Ge..." From their work, as well as the work of Carlson, Marfaing and Hamakawa, they concluded that alloys of amorphous silicon, germanium and hydrogen "have shown poor photovoltaic properties" and thus new "photovoltaic film cell materials must be found having spectral response at about 1 micron for efficient stacked cell combinations with a Si:H." (J. J. Hanak, B. Faughnan, V. Korsun, and J. P. Pellican, presented at the 14th IEEE Photovoltaic Specialists Conference, San Diego, Calif., Jan. 7-10, 1980).

Due to the beneficial properties attained by the introduction of fluorine, amorphous alloys used to produce cascade type multiple cells may now incorporate fluorine as one possible method of reducing the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell material maintains high electronic qualities and photoconductivity when the adjusting element(s) are added to tailor the device wavelength characteristics for a specific photoresponsive application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce photovoltaic devices such as solar cells. However, with crystalline cells mass production was limited to batch processing techniques by the inherent time consuming growth requirements of the crystals. Unlike crystalline silicon which is limited to batch processing for the manufacture of solar cells, amorphous silicon semiconductor alloys can be deposited in multiple layers over large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386 filed Mar. 16, 1981 for Continuous Systems For Depositing Amorphous Semiconductor Material; Ser. No. 240,493 filed Mar. 16, 1981 for Continuous Amorphous Solar Cell Production System; and Ser. No. 306,146 filed Sept. 28, 1981 for Multiple Chamber Deposition and Isolation System and Method. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other deposition chambers to prevent the back diffusion of doping constituents into the intrinsic chamber. In the previously mentioned patent applications, wherein the systems are primarily concerned with the production of photovoltaic cells, isolation between the chambers is accomplished by employing isolation mechanisms in which an inert gas flowing over the substrate as it passes from one deposition chamber to an adjacent deposition chamber prevents cross contamination. However, none of those prior art isolation mechanisms are employed with apparatus adapted to produce tandem solar cells in a high volume, continuous processing system.

The many objects and advantages of the present invention will become clear from the drawings, the detailed description of the invention and the claims which follow.

BRIEF SUMMARY OF THE INVENTION

There is disclosed herein multiple chamber deposition apparatus for continuously producing under steady state conditions tandem, amorphous, photovoltaic cells having a p-i-n-type configuration. The apparatus is adapted to sequentially and continuously pass either an elongated web of substrate material or a substrate plate carried by a conveyor belt through each of at least six operatively and physically interconnected deposition chambers. Each deposition chamber includes a conduit through which a preselected reaction gas mixture is introduced into the chamber, and a mechanism for depositing successive amorphous semiconductor layers onto the deposition surface of the substrate, so that the composition of each amorphous semiconductor layer will depend upon the gas mixture introduced into the deposition chamber. By employing a continuous processing technique, it is no longer necessary to sequentially initiate and terminate the requisite pressure, temperature, purity, and gas flow conditions for depositing each amorphous semiconductor layer. Therefore, the present invention not only improves productivity, but also improves the quality of the semiconductor layers and reduces fluctuations due to start-up and shut-down conditions.

In the preferred embodiment of the invention, the first layer deposited on the substrate will be an amorphous, p-type conductivity semiconductor layer, the second layer deposited on the substrate will be an amorphous, intrinsic semiconductor layer and the third layer deposited on the substrate will be an amorphous, n-type conductivity semiconductor layer. The second and each succeeding one of the tandem p-i-n-type cells deposited on the substrate material will be band gap adjusted to match generated currents, thereby increasing open circuit voltage.

Since different reaction gas mixtures are introduced in each one of the triad of deposition chambers, an isolation mechanism, either in the form of a mechanical seal or a gas gate is provided between each adjacent chamber to establish isolation between chambers and prevent cross-contamination. An isolation chamber is positioned between the p-type and n-type chambers of adjacent triads of deposition chambers to similarly establish isolation and prevent cross-contamination therebetween.

In the preferred embodiment, two triads of deposition chambers (a total of six chambers) are provided to produce a tandem arrangement of two photovoltaic cells. The two triads of chambers have introduced thereinto: at least a silicon containing gas into the second and fifth deposition chambers; at least a silicon containing gas and a gas containing a p-dopant into the first and fourth deposition chambers; and at least a silicon containing gas and a gas containing an n-dopant into the third and sixth deposition chambers. Band gap adjusting elements, such as carbon or germanium, may be added to the silicon alloy layers to adjust the light absorption characteristics of each layer. In the preferred embodiment, the band gap of the amorphous, dopant layers is widened by the addition of carbon and the band gap of the lowermost intrinsic layer is narrowed by the addition of germanium. Other band gap adjusting elements include but are not limited to oxygen, nitrogen and tin. Although, one preferred embodiment contemplates the production of two p-i-n type cells by employing two triads of deposition chambers, in another preferred embodiment of the invention, three triads of deposition chambers are employed to produce these p-i-n type cells.

Other significant structural features of the present invention include an automatic threader for forwarding a web of substrate material from a position adjacent the first deposition chamber to a position adjacent the final deposition chamber; and an interleaf assembly for removing protective sheeting from between adjacent layers of the web of substrate material wound on the substrate supply core, and introducing protective sheeting between adjacent layers of the web of substrate materials as it is wound onto the substrate take-up core after the deposition process has been completed.

Also disclosed herein, is the method of continuously depositing at least two amorphous photovoltaic cells onto the surface of substrate material which is adapted to continuously move through a series of at least six interconnected, dedicated deposition chambers. Reaction gas mixtures of varying electrical conductivity are introduced into each of the deposition chambers for depositing successive p-type, intrinsic, and n-type amorphous semiconductor layers onto the substrate. The method may comprise the steps of: effecting a vacuum in the deposition chambers through which the substrate is advanced; heating the chambers to warm the substrate and reaction gas mixtures; introducing the reaction gas mixtures into the chambers in such a manner that (1) the intrinsic gas mixture is substantially free from contamination by adjacent n-dopant or p-dopant gas mixtures, and (2) adjacent n-dopant and p-dopant gas mixtures do not cross-contaminate; forming a plasma from the gas mixtures introduced into the deposition chambers; moving the substrate through the plasma region of each deposition chamber for depositing the gas mixtures onto the substrate; and maintaining the substrate temperature, the speed of substrate travel, the substrate tension, the mixtures of reaction gases, the pressure differentials between adjacent chambers, and the vacuum pressures, whereby tandem, amorphous, photovoltaic solar cells are continuously produced on the web of substrate material.

There is also disclosed herein an automatic web steering system, for continuously "steering" the web of substrate material as it moves through the deposition chambers and is wound onto the take-up reel. The terms "steering" or "tracking" will be used hereinafter to refer to the automatic ability of the system to position and align the continuously moving web of substrate material relative to the longitudinal axis of the take-up reel about which the web is ultimately wound. The steering or tracking system thereby prevents "telescoping" of the coiled web upon the take-up reel, and thus eliminates the possibility of damage to the finished product during subsequent handling. Steering of the advancing web is assured by placing or relieving tension upon one edge of the advancing web by means of a steering idler roller, thus causing the web to "ride" in a direction perpendicular to its direction of travel. The position of the steering idler roller is controlled through a mechanical linkage by a servo-motor located outside of the deposition chamber, and operably connected to the mechanical linkage by means of a rotary vacuum seal. The servo-motor is in turn controlled by a sensor which determines the position of the advancing web relative to preselected locations on that roller. Locating the servo-motor outside the deposition chamber prevents contamination of the chamber by effluents outgassing from the motor, and also prevents damage to the motor in a low pressure environment. Furthermore, service and replacement of the motor is greatly facilitated when it is located outside the chamber.

There is further disclosed herein a mechanism for controlling the tension upon the web of substrate material. The tension control system comprises a drive roller which advances the web of substrate material through the deposition apparatus and a tensioning roller which acts as a dynamic brake to resist rotation thereof by the drive roller. The system also (1) continuously monitors and displays the level of tension to which the web is subjected, and (2) includes apparatus independent of, but cooperating with the tensioning roller for adjusting the level of tension to which the web is subjected.

Additionally, disclosed herein is a method of detecting leaks in the chambers of the glow discharged position apparatus of the present invention, wherein the atmosphere in one portion of the apparatus is isolated from the remainder of the apparatus and the isolated portion is tested for leaks. Complementing that disclosure is a leak-test assembly adapted to be substituted for the gas gate assembly or the mechanical seal assembly and disposed in the passageway between adjacent chambers, thereby isolating a selected portion of the apparatus for leak analysis.

Also, there is disclosed a removable powder trap for collecting powder and other debris following the glow discharge deposition of semiconductor layers onto the substrate as it passes through one of the glow discharge deposition chambers. The powder trap includes a plurality of staggered baffle plates about which the nondeposited plasma and nonused reaction gas mixture pass after flowing across the cathode of the deposition chamber. By removably supporting the powder trap within the chamber and forcing substantially all of the reaction gas mixture to flow therethrough, an exchange of the "dirty" trap for a fresh one, reduces clean-up time.

Finally, there is disclosed herein an alternate embodiment of the mechanism for substantially isolating the reaction gas mixtures introduced into adjacent deposition chambers from each other. In this embodiment, the isolation mechanism is formed as a mechanical seal in which a pair of elongated rollers are sealingly disposed at opposite ends of a substantially large area mini-vacuum chamber. The rollers are covered by material which is sufficiently soft so as not to damage the layered surface of the web of substrate material and substantially rigid so as to substantially prevent leakage therepast. The mini-chamber is maintained at a lower internal pressure than either of the adjacent chambers for substantially preventing dopant reaction gas mixtures from flowing back into the deposition chambers.

BRIEF DESCRIPTION OF THE DRAWINGS

FIG. 1 is a fragmentary, cross-sectional view of a tandem or cascade photovoltaic device comprising a plurality of p-i-n-type cells, each layer of the cells formed from an amorphous, semiconductor alloy in accordance with the present invention;

FIG. 3 is a diagrammatic representation of the multi-chamber deposition apparatus of the present invention, as in FIG. 2, and further showing the isolation mechanisms connecting adjacent chambers of the assembly, the substrate supply and take-up assembly, the automatic threader assembly, the interleaf removal and take-up assembly, and the substrate tensioning assembly;

FIG. 4 is diagrammatic representation of the multiple-chamber deposition apparatus of the present invention showing the isolation mechanisms, the substrate stretching from the supply chamber to the take-up chamber, the heating elements, and the controls for establishing and maintaining the selected temperature for the heating elements;

FIG. 10, is an exploded view of the leak test assembly illustrating the two closure plates, the O-ring and the fasteners;

FIG. 10A is an enlarged partial cross-sectional view between two chambers of the multiple chamber deposition apparatus of the present invention showing the connection of the leak test assembly thereto and the gas gate form of the isolation mechanism in phantom lines;

FIG. 12 is a diagrammatic representation of the first triad of deposition chambers of FIG. 2 and specifically illustrating the mechanical seal embodiment of the isolation mechanisms which operatively connect adjacent chambers of the glow discharge assembly of the present invention; and FIG. 12A is an enlarged, framentary view of a modified form of the mechanical seal of FIG. 12 and illustrating the substrate tensioned against a sealing roller to develop a small gap relative to an adjacent, troughed block.

DETAILED DESCRIPTION OF THE DRAWINGS

I. The Product

Figure 2:
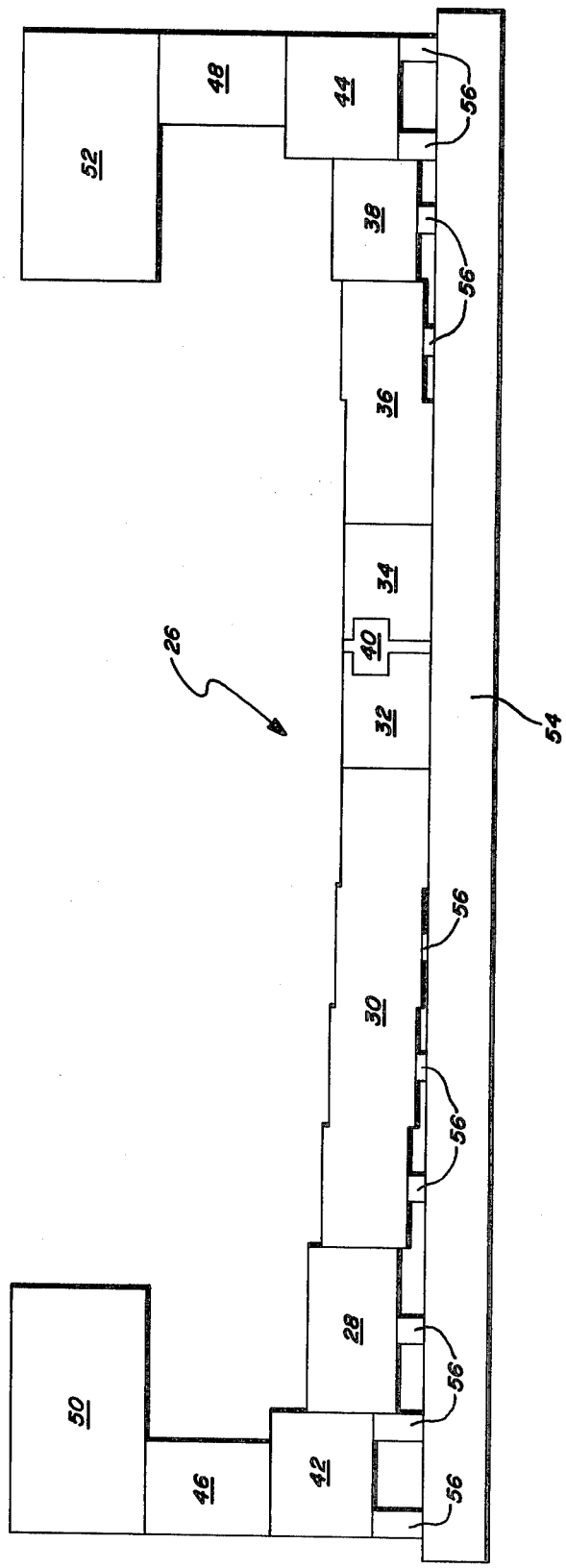
FIG. 2 is a diagrammatic representation of a multiple deposition chamber apparatus adapted to continually produce amorphous, stacked photovoltaic cells in accordance with the present invention.

Referring now to the drawings and particularly to FIG. 1, a tandem or cascade type, photovoltaic cell, formed of successive p-i-n layers each including an amorphous semiconductor alloy, is shown generally by the numeral 10. It is for the continuous production of this type of photovoltaic cell wherein amorphous alloy layers are successively deposited onto a moving substrate, that the multiple chamber apparatus of the present invention was constructed.

More particularly, FIG. 1 shows a plurality of p-i-n photovoltaic devices such as solar cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous material, for purposes of this application, the term "substrate" shall include not only a flexible film, but also any elements added thereto by preliminary processing. Most commonly the substrate material 11 may be a continous web of stainless steel, aluminum, tantalum, molybdenum or chrome.

Each of the cells 12a, 12b and 12c include an amorphous semiconductor body containing at least a silicon alloy. Each of the semiconductor bodies includes an n-type conductivity layer 20a, 20b, and 20c; and intrinsic layer 18a, 18b and 18c; and p-type conductivity layer 16a, 16b and 16c. By "amorphous" the present invention contemplates the inclusion of all materials exhibiting long range disorder, regardless of their short or intermediate range order and regardless of whether those materials are otherwise labeled polycrystalline or crystalline. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, this invention is equally adapted to produce tandem n-i-p cells by simply reversing the order of depositing the n-type and p-type layers onto the substrate.

For each of the cells 12a, 12b and 12c, the p-type semiconductor layers are characteristically light absorptive and high conductivity. The intrinsic semiconductor layers are characterized by an adjusted wave length threshold for solar photoresponse, high light absorption, low dark conductivity and high photoconductivity, including sufficient amounts of a band gap adjusting element or elements to optimize the band gap for the particular cell application. Preferably, the intrinsic layers are band gap adjusted to provide cell 12a with the lowest band gap, cell 12c with the highest band gap, and cell 12b with a band gap between the other two. The n-type semiconductor layers are characterized by low light absorption, high conductivity alloy layers. The thickness of the n-type layers can be in the range of about 25 to 100 angstroms. The thickness of the band gap adjusted, amorphous intrinsic alloy layers can be between about 2,000 to 3,000 angstroms. The thickness of p-type layers can be between 50 to 200 angstroms. Due to the shorter diffusion length of the holes, the p-type layers generally will be as thin as possible. Further, the outermost layer, here the n-type layer 20c, will be as thin as possible to avoid absorption of light and need not include the band gap adjusting element.

The method and apparatus of the present invention, wherein amorphous semiconductor alloy layers are deposited onto a continuously moving substrate, will now be described with reference to the remaining drawings. However, it is to be understood that following the deposition of the semiconductor alloy layers, a further deposition step may be performed in a separate environment. In this step, a TCO (transparent conductive oxide) layer 22 is added, which layer may, for example, be indium tin oxide (ITO), cadmium stannate ($Cd_2SnO_4$), or doped tin oxide ($SnO_2$). This layer 22 is characterized by low resistivity, high electrical conductivity and high light transmissivity.

An electrode grid 24 may be added atop the TCO layer. For a tandem cell having a sufficiently small area, the TCO layer 22 is generally sufficiently conductive so the grid 24 is not necessary. However, if the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Chamber Apparatus

A. General Arrangement of Chambers

Turning now to FIG. 2, a diagrammatic representation of a multiple glow discharge chamber deposition apparatus for the continuous production of tandem or cascade-type photovoltaic cells is illustrated generally by the reference numeral 26. The apparatus 26 includes a plurality of isolated and dedicated deposition chambers in accordance with the principles of the present invention. The term "isolated" as used herein will mean that the reaction gas mixtures of adjacent deposition chambers are substantially prevented from cross-contamination. Note that the word "prevented" has been modified by "substantially"; this is because no isolation mechanism, either of the mechanical seal or gas gate variety is 100% effective. Moreover, (very slight back diffusion of dopant reaction gas mixtures into the intrinsic deposition chamber has been found to provide a desirable profiling of the intrinsic layer. However, this doping of the intrinsic layer should be minimal (in the parts per million range) and should be capable of quantitative determination. And the term "dedicated" will be defined herein as meaning that each individual deposition chamber has introduced thereinto a particular reaction gas mixture protected from contamination from reaction gas mixtures in adjacent deposition chambers and from environmental conditions.

The apparatus is adapted to produce a high volume of large area, amorphous, photovoltaic, stacked cells having a p-i-n-type configuration on the deposition surface of a substrate material which is continually fed therethrough. To deposit the amorphous semiconductor layers required for producing a tandem cell of the p-i-n-type configuration, the apparatus 26 includes: a first deposition chamber 28 in which a p-type conductivity amorphous semiconductor layer is deposited onto the deposition surface of the substrate 11 as the substrate 11 passes therethrough; a second deposition chamber 30 in which an intrinsic amorphous semiconductor layer is deposited atop the p-type semiconductor layer on the deposition surface of the substrate 11 as the substrate 11 passes therethrough; a third deposition chamber 32 in which an n-type conductivity semiconductor layer is deposited atop the intrinsic layer on the deposition surface of the substrate 11 as the substrate 11 passes therethrough; a fourth deposition chamber 34 in which a second p-type conductivity amorphous semiconductor layer is deposited atop the n-type semiconductor layer on the deposition surface of the substrate 11 as the substrate 11 passes therethrough; a fifth deposition chamber 36 in which a second intrinsic amorphous semiconductor layer is deposited atop the second p-type semiconductor layer on the deposition surface of the substrate 11 as the substrate 11 passes therethrough; and a sixth deposition chamber 38 in which an n-type conductivity semiconductor layer is deposited atop the intrinsic layer on the deposition surface of the substrate 11 as the substrate 11 passes therethrough.

It should be apparent that, although six deposition chambers (two triads of the three deposition chambers) have been described, additional triads of deposition chambers or additional individual deposition chambers may be added to the machine to provide the machine with the capability of producing any number of tandem photovoltaic cells having p-i-n-type or n-i-p-type configurations. It is to be understood that, although, in the preferred embodiment, the substrate material is a continuous conductive web, the concept of the present invention is equally adapted for depositing successive layers atop a continuous glass substrate or atop discrete conductive or glass substrate plates continuously fed through the plurality of deposition chambers. It should also be apparent that, since the length of the path of travel of the substrate through individual deposition chambers is proportional to the thickness of the p-type or intrinsic or n-type layer deposited in a given chamber, either (1) the length of the path of travel of the substrate through an individual deposition chamber may be increased or decreased, or (2) the speed of the web of substrate material may be increased or decreased to deposit on the substrate a layer of desired thickness. As an example of the foregoing, the length of the path of travel of the substrate 11 through the second deposition chamber 30, wherein the first intrinsic semiconductor layer is deposited, is approximately twice the length of the path of travel of the substrate 11 through the fifth deposition chamber wherein the second intrinsic alloy layer is deposited, thereby producing a much thicker first intrinsic alloy layer than second intrinsic semiconductor layer. The thickness of all of the semiconductor layers will be further discussed hereinafter.

Still referring to FIG. 2, the apparatus 26 further includes an intermediate chamber 40 for isolating the n-type reaction gas mixture flowing through the third deposition chamber 32 and the p-type reaction gas mixture flowing through the fourth deposition chamber. Positioned on the side of the first deposition chamber 28 opposite the second deposition chamber 30 and physically contacting the first deposition chamber 28 is a pay-off, substrate-directing chamber 42; and positioned on the side of the sixth deposition chamber 38 opposite the fifth deposition chamber 36 is a post-deposition, substrate-directing chamber 44. Positioned immediately above and physically contacting the pay-off, substrate-directing chamber 42 is a cleaning chamber 46; and positioned immediately above and physically contacting the post-deposition, substrate-directing chamber 44 is a cool-down chamber 48. Finally, positioned immediately above and physically contacting the cleaning chamber 46 is a substrate supply chamber 50; and positioned immediately above and physically contacting the cool-down chamber 48 is a substrate take-off chamber 52.

B. The Non-Horizontally Aligned Chambers

The multiple chamber apparatus 26, as defined by the plurality of contiguous chambers described hereinabove, is mounted on a rigid framework which includes one or more horizontal base members 54 and a plurality of vertically extending, rigid studs 56 of varying lengths. The studs 56 are adapted to be positioned beneath chambers of the apparatus 26 so that the chambers are supported at a lowermost elevation adjacent the intermediate chamber 40 thereof and the chambers gradually increase in their vertical distance above the base members 54 so as to reach a maximum elevation above the base members 54 at the pay-off, substrate-directing chamber 42 and the post-deposition, substrate-directing chamber 44. By sequentially and gradually staggering the height of the chambers, the web of substrate material 11 passing therethrough is permitted to sag under its own weight and thereby reduce the build up of stress initiated by drive and torque motors pulling the substrate 11 through the chambers.

C. The Isolation Mechanisms

Referring now to FIG. 3, the diagrammatic representation of the multiple chamber apparatus 26 illustrated in FIG. 2 and generally described hereinabove has been duplicated. Added to that diagrammatic representation are the isolation mechanisms for the reaction gas mixtures shown diagrammatically as 58a-58j; the substrate supply and take-up assembly shown generally as 60; the automatic threader assembly shown generally as 62; the interleaf assembly shown generally as 64; and the substrate tensioning assembly shown generally as 66. These assemblies will now be described in detail.

1. The Gas Gates

The isolation mechanisms 58a-58j generally function to provide a small passageway through which the substrate 11 is adapted to continually pass while substantially preventing contamination of the reaction gas mixture of one chamber with the reaction gas mixture of an adjacent chamber. In the preferred embodiment, the isolation mechanisms 58a-58j take the form of gas gates. In a second preferred embodiment, the isolation mechanisms 58a-58j may be formed by mechanical seals. Since the gas gate embodiment is preferred (1) the following discussion will first deal with the isolation of reaction gas mixtures by the gas gate configuration and then by the mechanical seal configuration; and (2) the drawings of the deposition apparatus diagrammatically illustrate the gas gate configuration. More particularly, the gas gate 58a provides a passageway between the substrate supply chamber 50 and the cleaning chamber 46; the gas gate 58b provides a passageway between the cleaning chamber 46 and the pay-off, substrate-directing chamber 42; the gas gate 58c provides a passageway between the pay-off, substrate-directing chamber 42 and the first deposition chamber 28; the gas gate 58d provides a passageway between the first deposition chamber 28 and the second deposition chamber 30; the gas gate 58e provides a passageway between the second deposition chamber 30 and the third deposition chambers 32; the gas gate 58f provides a passageway between the third deposition chamber 32 and the intermediate isolation chamber 40; the gas gate 58g provides a passageway between the intermediate isolation chamber 40 and the fourth deposition chamber 34; the gas gate 58h provides a passageway between the fourth deposition chamber 34 and the fifth deposition chamber 36; the gas gate 58i provides a passageway between the fifth deposition chamber 36 and the sixth deposition chamber 38; and the gas gate 58j provides a passageway between the sixth deposition chamber 38 and the post-deposition, substrate-directing chamber 44. Although no gas gates are provided between the post-deposition, substrate-directing chamber 44 and the cool-down chamber 48 and the cool-down chamber 48 and the take-up chamber 52, relatively small slit-like openings 68a and 68b, respectively, provide the passageways for the substrate 11 therebetween. Further, if contamination became a problem, the addition of gas gates between those chambers would not depart from the spirit of the present invention.

Figure 3A:
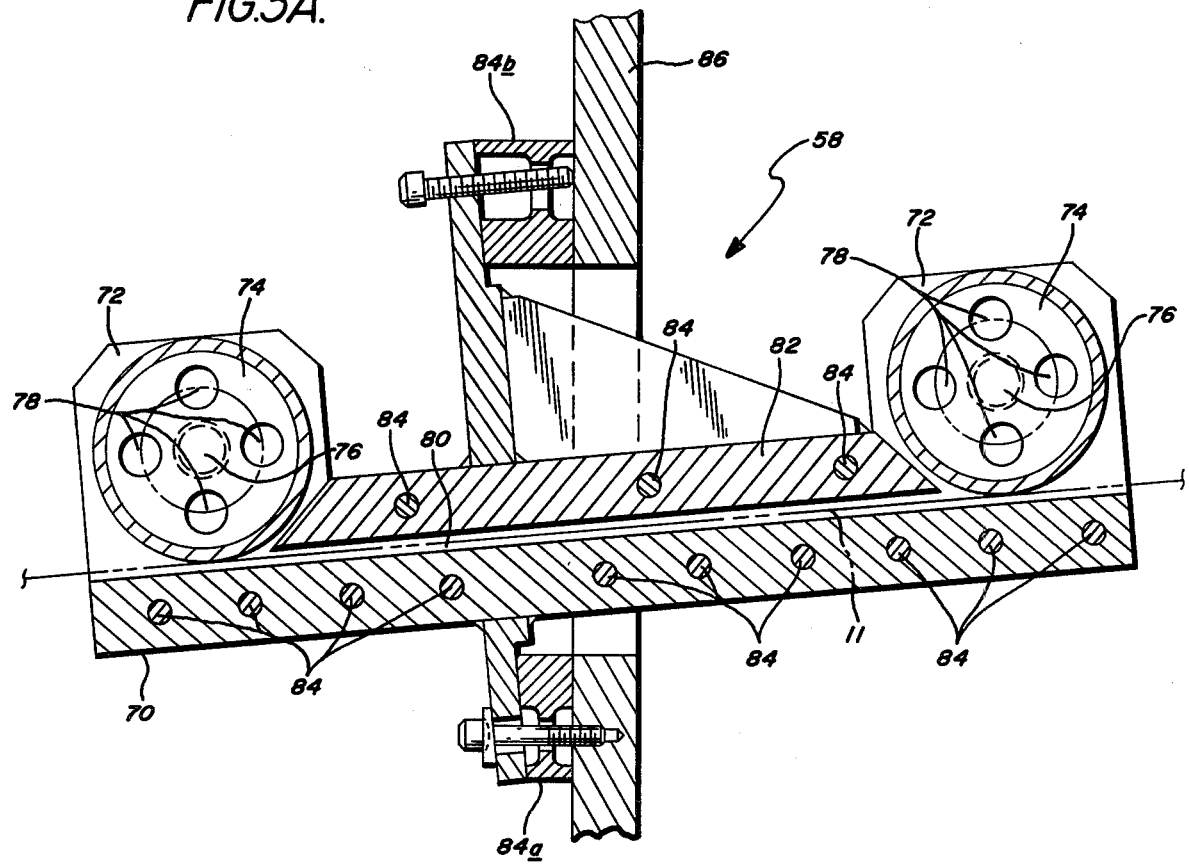
FIG. 3A is an enlarged, cross-sectional view of one possible configuration for the gas gate 58j, shown in FIG. 3, and adapted to illustrate the passageway through which the substrate passes, the rollers for directing the substrate through the gas gate, and the angle that passageway makes relative to the horizontal.

Although for purposes of this application, the structural configuration of the gas gates 58a–58j is unimportant as long as the gates operate to permit substantially unidirectional gas flow from adjacent chambers while allowing the substrate 11 to pass therethrough, FIG. 3A depicts a front elevational view of one possible gas gate configuration, shown generally by the reference numeral 58. The gas gate 58 of FIG. 3A generally comprises a lower plate 70 to which oppositely disposed, transversely elongated roller assembles 72 are secured. Cylindrical rollers 74 are rotatably mounted on an axle 76, opposite ends of which are rotatably secured to the assemblies 72. The length of each cylindrical roller 74 is greater than the width of the web of substrate material 11 passing through the multiple chamber apparatus 26 so that the entire width of the substrate 11 may contact a portion of the circumference of the roller surface. A plurality of roller bearings such as 78 provide for substantially frictionless rotation of the cylindrical elongated rollers 74 about the axles 76. The cylindrical rollers 74 are adapted to guide the web of substrate material 11 through a relatively narrow slot or passageway 80 formed between the top surface of the lower gas gate plate 70 and the bottom surface of the top gas gate plate 82. By establishing a substantially unidirectional flow of the reaction gas mixture from one chamber into an adjacent chamber, contamination of the intrinsic deposition chambers (in the preferred embodiment of the present invention contamination of the third and fifth deposition chambers 30 and 36, respectively) by p-type and n-type dopant reaction gas mixtures introduced into the adjacent chambers (in the preferred embodiment of the present invention p-type gas mixtures are introduced into the first and fourth deposition chambers and n-type gas mixtures are introduced into the third and sixth deposition chambers) is substantially prevented. However, some backflow or back diffusion of dopant gas mixtures along the walls of the passageway 80 through the gas gate 58 is always present. To further minimize this backflow, the dopant gas side of the gas gates 58d, 58e, 58h and 58i (between the dopant chambers and the adjacent intrinsic chambers) may also be provided with a port (not shown) through which an inert gas such as argon is introduced. By so introducing an inert gas, it is for the most part, the inert gas rather than the dopant gases in the dopant chambers which flow into the intrinsic chambers. This process will hereinafter be referred to as "argon sweeping". Since the substantial prevention of contamination of the intrinsic deposition chamber is essential to the manufacture of a high efficiency photovoltaic product, argon sweeping increases the efficiency of the photovoltaic device.

Since one aspect of the present invention is to stagger the elevation of the chambers of the multiple chamber assembly 26 to permit the substrate 11 to sag under its own weight, the deposition chamber gas gates 58c–58j (although the isolation mechanisms will hereinafter be referred to as gas gates, mechanical seals may also be used without departing from the spirit or scope of the present invention) must be slightly angled to the horizontal. To achieve the desired angularity, a first short adjusting wedge 84a is positioned below the lower plate 70 and a second longer adjusting wedge 84b is positioned above the upper plate 82. The entire gas gate 58 may then be secured to a vertical plate 85 which may be the wall separating adjacent deposition chambers.

From FIG. 3, it should be apparent that gas gates 58f and 58g need not be angled relative to the horizontal because the third deposition chamber 32, the fourth deposition chamber 34 and the isolation chamber 40 are maintained at the same lowermost elevation. However, gas gates 58h, 58i and 58j are angled slightly relative to the horizontal in the direction of the gas gate 58 shown in FIG. 3A, thereby accomodating the inherent tendency of the substrate 11, extending from the fourth deposition chamber 34 to the post-deposition turning roller 66c, to sag under its own weight. The gas gates 58e, 58d and 58c are angled relative to the horizontal in a direction opposite the direction of the gas gate 58 shown in FIG. 3A, also in an attempt to accomodate the inherent tendency of the substrate 11, extending from the pre-deposition idler roller 66b to the third deposition chamber 32 to sag under its own weight. In actuality, the angular disposition of the passageway 80 through the gas gates 58 will be approximately 0 to +8 degrees to horizontal. In this manner, undue stress of the web of substrate material is eliminated.

As to gas gates 58a and 58b, it should be obvious that the passageway 80 therethrough is oriented in a vertical, rather than a horizontal plane because the web of substrate material 11 is traversing a generally vertical path from the supply chamber 50 through the cleaning chamber 46 and into the pay-off, substrate-directing chamber 42. Further note, that one of the elongated rollers 74 may be eliminated from those gas gates (such as 58a, 58b, 58c and 58j) which are located adjacent substrate idler rollers (such as 66a, 66b and 66c described hereinafter). This is because the substrate idler rollers perform the function of directing the substrate 11 into, through and/or out of a gas gate.

2. The Mechanical Seals

In the alternate preferred embodiment of the mechanism for substantially isolating reaction gas mixtures from adjacent chambers, a mechanical seal may replace the gas seal discussed hereinabove. A first embodiment of this mechanical seal will be referred to generally by the reference numeral 300.

Referring now to FIG. 12, the mechanical seals 300a and 300b, respectively, are shown isolating the reaction gas mixtures introduced into the intrinsic deposition chamber 30 from the reaction gas mixtures introduced into the dopant deposition chambers 28 and 32. While this view is illustrative of only one triad of deposition chambers, it should be readily apparent that the mechanical seals 300 may be disposed between the adjacent chambers of further triads of deposition chambers, in a like manner, without departing from the spirit of this invention.

More particularly, each of the mechanical seals, 300a and 300b, includes a pair of elongated, cylindrical sealing rollers 302 disposed at opposite ends of a mini-vacuum chamber 304. The length of the sealing rollers 302 and the mini-chambers 304 must be at least sixteen inches, which is the width of the web of substrate material 11 adapted to pass therethrough. The width of each of the mini-chambers 304 is preferably at least eight inches so that each of the mini-chambers 304 has a large volume capacity for reasons which will become apparent hereinafter. Inert gas supply conduits 306 are adapted to introduce an inert gas such as argon into the mini-chambers 304, while pumps 308 are adapted to cooperate with exhaust conduits 310 to withdraw the inert gas and any reaction gas mixtures which have leaked past the sealing rollers 302 and entered the mini-chambers 304 therefrom. The introductory rate of flow of the inert gas relative to the exhaust flow rate of the inert gas and reaction gas mixtures is such as to develop a pressure within the mini-chamber 304 signficantly greater than the pressure in the adjacent deposition chambers. Specifically, the pressure in the intrinsic deposition chamber 30 may be 0.6 torr, the pressure in the p-type dopant deposition chamber 28 may be 0.55 torr, the pressure in the n-type dopant deposition chamber 32 may also be 0.55 torr and the pressure in each of the mini-chambers 304 may be 0.4–0.5 torr. By maintaining pressures such as the foregoing, the flow of gases is from the deposition chambers into the mini-isolating-chambers 304 disposed therebetween. Further, since the lowest pressure is in the intrinsic deposition chamber 30, even if dopant reaction gas mixtures enter the mini-chambers 304, and are not exhausted therefrom via exhaust conduit 310, they are drawn back into the higher pressured dopant deposition chambers. And because, as mentioned hereinabove, the mini-chambers 304 provide a relatively high volume container, any dopant reaction gas mixtures entering thereinto (1) are greatly diluted by the inert gas, and (2) remain in the mini-chambers 304 for a sufficient length of time to be withdrawn along with the inert gas via exhaust conduits 310.

The biggest problem in providing mechanical isolation such as that illustrated in FIG. 12, is in selecting an appropriate material from which to cover the sealing rollers 302. The material must (1) be soft enough to prevent scratching, marring or otherwise damaging the layered surface of the web of substrate material 11 which it must contact and against which it must provide an air-tight seal; and (2) be sufficiently rigid to substantially prevent reaction gas mixtures introduced into adjacent chambers from cross-contaminating one-another. Stainless steel roller cores covered by either Teflon or a silicone polymer have the inherent abilities to provide a good seal without damaging the semiconductor layers deposited onto the substrate, provided that care is taken in driving the rollers 302 at the appropriate rotational velocities. Specifically, to prevent frictional drag on the web of substrate material 11, the sealing rollers 302 must rotate in the direction of the arrows shown in FIG. 12 and at the same speed which the substrate is traveling through the deposition apparatus 26. Further, the material covering the sealing rollers 302 must provide a longitudinal seal by bearing against the web of substrate material 11 and a transverse seal by bearing against the side walls of the mini-chamber 304.

A second preferred form of the mechanical seal embodiment of the isolation mechanism is illustrated in FIG. 12A. As depicted in that figure, the mechanical seal, shown generally by the reference numeral 350, is operatively disposed between the p-type dopant deposition chamber 28 and the intrinsic deposition chamber 30. The seal 350 is adapted to substantially prevent dopant reaction gas mixture from back diffusing and contaminating the intrinsic reaction gas mixture in intrinsic chamber 30.

The mechanical seal 350 includes an elongated, cylindrical sealing roller 352 and a cooperating, trough-shaped sealing block 354 at each of the opposite ends of a mini-vacuum chamber 356. The shape of the troughed side of the sealing blocks 354 is substantially identical to the shape of the associated circumference of the sealing rollers 352. In this manner, a precisely dimensioned gap "d" may be maintained between the outer diameter of the sealing rollers 352 and the inner surface of the troughed side of the blocks 354. By tensioning the web of substrate material 11 against the circumferential surface of the rollers 352, the gap "d" may be maintained at a distance of approximately ten mils without having the web 11 contact and be damaged by the troughed surface. Since the gas gate gap is typically about ¼ inches, a substantial reduction is thereby achieved with a corresponding reduction in back diffusion of dopant reaction gas mixtures into the intrinsic deposition chamber 30.

As with the previously described mechanical seal embodiment 300, the length of the mini-chamber 356 and the sealing rollers 352 is about sixteen inches and the width of the mini-chamber 356 is about at least eight inches so as to provide a large volume capacity mini-chamber. Inert supply gas conduit 358 is adapted to introduce an inert gas such as argon into the mini-chamber 356, while pump 360 is adapted to cooperate with an exhaust conduit 362 to withdraw the inert gas and any dopant reaction gas mixtures which have leaked into the mini-chamber 356. As with the previously described embodiment, the introductory rate of flow of the inert gas relative to the exhaust flow rate of the inert gas and reaction gas mixtures is such as to develop a pressure within the mini-chamber 356 significantly greater than the pressure within the adjacent depositon chambers. Specifically, the pressure in the intrinsic deposition chamber 30 may be 0.6 torr, the pressure in the p-type dopant deposition chamber may be 0.55 torr and the pressure in the mini-chamber 356 may be 0.4–0.5 torr. Since the mini-chamber 356 provides a relatively high volume container, any dopant reaction gas mixtures entering thereinto (1) are greatly diluted by the inert gas, and (2) remain therein for a sufficient length of time to be withdrawn along with the inert gas via exhaust conduit 362. Finally, the rollers may be covered with any well known, low friction sealing material; but, in contrast to the dual-roller seal, the layered surface of the substrate 11 is not brought into contact with a sealing surface.

Whether the isolation of reaction gas mixtures is provided by the gas gates 58 or the two disclosed embodiments of the mechanical seals 300 and 350, the isolation mechanisms must operate to prevent back diffusion of dopant gases into the intrinsic deposition chamber, because contamination of the intrinsic semiconductor layer cannot be tolerated if the apparatus 26 is to produce a high efficiency photovoltaic device.

D. The Substrate Guiding and Tensioning System

The web of substrate material 11 is wound about a substrate supply or pay-off core 60a which rotates with and is positioned centrally on a substrate supply or pay-off mandril 60b. As previously mentioned, the supply core 60a and the supply mandril 60b are housed in the substrate chamber 50. The substrate 11 is adapted to move from the supply core 60a on the supply mandril 60b to a substrate supply idler roller 66a, also located in the substrate supply chamber 50. The substrate supply idler roller 66a is adapted to change the path of movement of the substrate 11 by directing the substrate 11 into a generally vertical path of travel through the gas gate 58a and the cleaning chamber 46, the gas gate 58b and the pay-off, substrate-directing chamber 42, to a pre-deposition turning substrate roller 66b. The turning idler roller 66b again changes the direction of travel of the web of substrate material 11 so that the substrate 11 assumes a generally horizontal path of travel through the gas gate 58c and the first deposition chamber 28, the gas gate 58d and the second deposition chamber 30, the gas gate 58e and the third deposition chamber 32, the gas gate 58f and the intermediate isolation chamber 40, the gas gate 58g and the fourth deposition chamber 34, the gas gate 58h and the fifth deposition chamber 36, the gas gate 58i and the sixth deposition chamber 38, and the gas gate 58j and into the post-deposition, substrate-directing chamber 44. A post-deposition idler turning roller 66c receives the web of substrate material 11 from the gas gate 58j and changes its direction of travel to a generally vertical path from the post-deposition, substrate-directing chamber 44, through the slotted passageway 68a and the cool-down chamber 48, the slotted passageway 68b and into the substrate take-up chamber 52. Upon contacting the take-up idler roller 66d in the take-up chamber 52, the web of substrate material 11 is guided to the take-up core 60c which is mounted and centrally positioned on a take-up mandril 60d also housed within the take-up chamber 52.

A take-up drive motor 60e, connected to conventional take-up reduction gearing 60f, drives the take-up mandril 60d at an adjustable, preselected rate of speed. A take-up idler roller motor 66e connected to take-up idler roller reduction gearing 66f is employed to establish tension or torque between the substrate 11 wound about the take-up core 60c mounted on the take-up mandril 60d and the substrate 11 partially wound about the take-up idler roller 66d. The supply idler roller 66a is driven by a supply idler motor 66g connected to idler roller reduction gearing 66h for establishing tension in the web of substrate material 11 between the supply idler roller 66a and the take-up idler roller 66d. The supply mandril 60b is driven by a supply mandril motor 60g connected to supply mandril reduction gearing 60h so as to develop torque or tension between the substrate 11 wound about the supply core 60a mounted on the supply mandril 60b and the substrate 11 partially wound about the supply idler roller 66a.

It is advantageous, although not necessary, to provide the circumferential surface of the supply idler roller 66a and the take-up roller 66d with a non-slip coating. This coating prevents slippage of the web of substrate material 11, thereby aiding in maintaining a desired level of web tension. Materials such as urethanes, synthetic or natural rubbers or the like may be applied for this purpose.

The web tension control system also includes an apparatus for the continual measurement and display of the web tension. Shown in FIG. 3 is a force transducer 65 mounted on the hub of the pre-deposition turning roller 66b (not shown in this drawing is a similar transducer mounted on the oppositely disposed hub of the same roller). The force transducer 65 has associated therewith a web tension display 65a which enables the operator to directly read the level of web tension. One such force transducer is Model 3370 Strain Gauge Controller manufactured by the Daytronic Corporation. It has been found that accurate readings of the tension on the web of substrate material 11 are obtained if one force transducer is mounted on each of the opposite ends of the hub of the pre-deposition turning roller 66b. In such a case, the total web tension is obtained by summing the readings from the two transducers 65. While the use of two transducers has been described as a preferred embodiment, a greater or lesser number of transducers may be employed in keeping with the spirit of the present invention. Similarly, the transducers need not be associated with a particular roller, but need only be located so as to accurately measure the tension of the web 11.

In the operation of this apparatus, the primary motive force advancing the web of substrate material 11 is provided by the take-up idler roller 66d which is driven at a constant speed by the take-up idler roller motor 66e. Tension upon the advancing web 11 is provided by the pay-off idler motor 66g operatively connected to the pay-off idler rollers 66a through the reduction gearing 66h. The pay-off idler roller motor 66g is operated as a dynamic brake, thereby tensioning the web 11, i.e., the motor 66g, is energized by a constant current power supply 66j in a direction of rotation opposite the direction of travel of the web 11. Further, the torque that the idler roller motor 66g provides is lesser in magnitude than the torque provided by the take-up idler motor 66e. Thus, the supply idler motor 66g rotates in a counterclockwise direction, a direction of rotation opposite the direction of rotation of the supply mandril 60b, thereby imposing a frictional drag upon the web 11. The magnitude of the drag thus established determines the tension on the web 11. Increasing the torque supplied by the supply idler roller motor 66g increases the tension on the web, and conversely, decreasing the torque supplied by the motor 66g, decreases the tension on the web. In order to maintain a constant level of web tension, the supply idler motor 66g is energized by the constant current power supply 66j.

Under operating conditions, the web tension display 65a is read by the operator of the apparatus; if more than one force transducer 65 is present, the reading from each is summed to obtain a representation of the total web tension. If this measured web tension value deviates from a preselected value, the operator then adjusts the constant current power supply 66j associated with the pay-off idler motor 66g so as to establish the preselected web tension. Once set, the web tension has been found to remain fairly constant throughout an operating run of the apparatus 26. However, if the speed of the web 11 is changed during a run, the amount of dynamic braking supplied by the pay-off idler motor 66g must also be changed, thereby necessitating adjustment of the constant current power supply 66j. It has been found under most operating conditions that a web tension of approximately 70 to 130 kilograms provides satisfactory results, however, use of different web materials or modifications in the apparatus such as the addition of further triads of deposition chambers will likely require a different value for the web tension.

The drive speed of the substrate 11, as set by the drive motors, described supra, is approximately one foot of substrate material per minute. Obviously, the rate of travel of the web of substrate material 11 through the multiple chambers of the apparatus 26 is dependent upon the rate that layers of semiconductor material of necessary thickness can be deposited on the substrate surface. It is preferred, in order to obtain photovoltaic-grade material, that semiconductor alloy layers be deposited at a rate of approximately ten angstroms per second. It is also desirable that the drive and torque motors, described hereinabove, be adjustable so that the tension on the web of substrate material 11 can be varied. The operating tension on the web of substrate material 11, which is defined as that tension on the web of substrate material 11 as it passes through chambers between the supply idler roller 66a and the take-up idler roller 66d should, desirably, be maintained below ten pounds per linear inch. The wrap-up tension, which is defined as that tension on the web of substrate material 11 as it passes between the take-up idler roller 66d and the take-up core 60c, should, desirably, be maintained as low as possible; and the pay-out tension, which is defined as that tension on the web of substrate material 11 as it passes between the supply idler roller 66a and the supply core 60a, should also, desirably, be maintained as low as possible.

It is further contemplated, although not illustrated, that each of the drive and torque motors, described above, be provided with tachometers. In this manner, the actual speed of rotation of the take-up core 60c and the supply core 60a can be monitored and adjusted with the constantly changing diameter of the web of substrate material 11 wound thereabout. Also, from monitoring the speed of the take-up torque motor tachometer, it would be possible to calculate the diameter of the roll of substrate 11 on the take-up core 60c or the supply core 60a at a given point in time, thereby providing an accurate determination of when the end of a particular web of substrate material 11 is at hand.

E. The Interleaf Assembly

The interleaf assembly 64, positioned adjacent the supply mandril 60b in the supply chamber 50, includes an interleaf removal roller 64a driven by an interleaf drive motor 64b, connected to the removal roller 64a by removal roller reduction gearing 64c. Because it is essential to maintain the quality of surface finish of the web of substrate material 11, protective interleaf sheeting such as 64d may be introduced between adjacent layers of the substrate material 11 wound about the supply core 60a. Obviously, the interleaf sheeting 64d must be removed from between adjacent layers of the substrate 11 prior to the initiation of the deposition processes in the chambers of the multiple chamber glow discharge deposition apparatus 26. To that end, the leading edge of the interleaf sheeting 64d from the supply core 60a is attached to the interleaf removal roller 64a and is wound thereabout as the web of substrate material 11 is unwound from the supply core 60a to move through the deposition apparatus 26. Similarly, in order to prevent disfiguration of or other harm to the semiconductor layers deposited upon the substrate 11 after the substrate 11 has passed through the deposition chambers, the interleaf sheeting 64a is desirably reintroduced between adjacent layers of the substrate 11 as the substrate 11 is wound about the take-up core 60c in the substrate take-up chamber 52. To accomplish this, a core 64e having protective interleaf sheeting 64d wound thereon is housed adjacent the take-up mandril 60d in the take-up chamber 52. The leading edge from the interleaf sheeting 64d, wound about interleaf core 64e, is attached to one side of the substrate 11 prior to winding the substrate about the take-up core 60c. Torque between the take-up core 60c and the interleaf introduction core 64e is provided by an interleaf motor 64f connected to the interleaf core 64e by conventional interleaf reduction gearing 64g. In the preferred embodiment, the interleaf sheeting 64b can be formed from any relatively soft, non-scratching synthetic resin which will not mar the surface of the amorphous semiconductor layers deposited within the glow discharge deposition chambers of the apparatus 26.

F. The Automatic Threader Assembly

The automatic threader assembly, generally designated by the reference numeral 62, includes a threader supply motor 62a operatively connected by conventional threader reduction gearing 62b to an automatic threader supply roller 62c. The automatic threader supply roller 62c is housed adjacent the supply mandril 60b in the supply chamber 50. On the take-up side, a threader take-up motor 62d is operatively connected to take-up threader reduction gearing 62e for driving an automatic threader take-up roller 62f housed adjacent the substrate take-up mandril 60d in the take-up chamber 52.

Figure 3B:
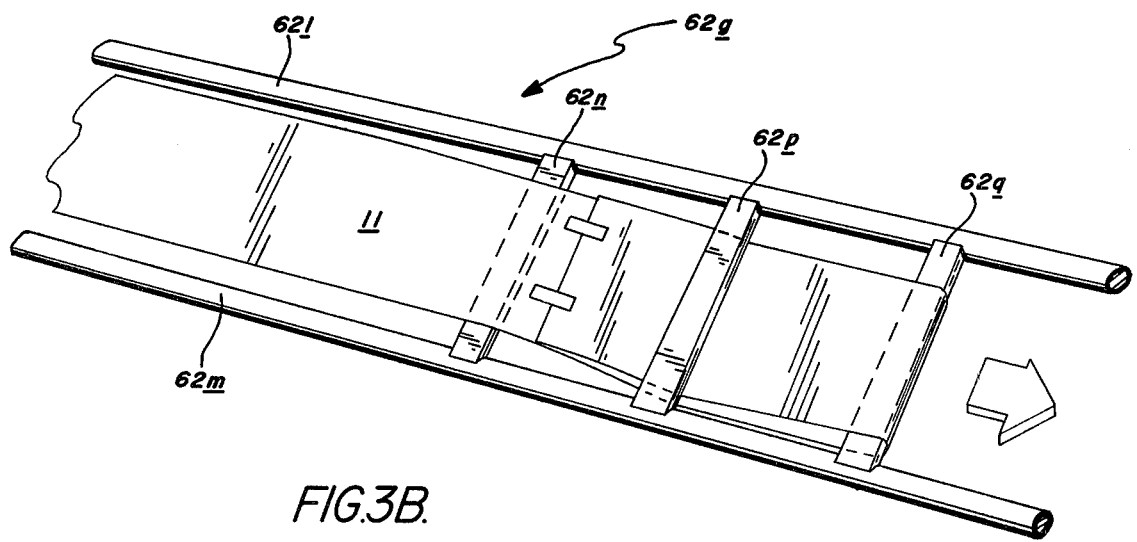
FIG. 3B is an enlarged, fragmentary, perspective view of the elongated flexible belt which forms part of the automatic threader assembly of the present invention.

In one preferred embodiment, an elongated flexible belt 62g, a section of which is shown in FIG. 3B, is wound about and extends from the threader supply roller 62c, the supply idler roller 66a, through the gas gate 58a and the cleaning chamber 46, the gas gate 58b and the pay-off, substrate-directing chamber 42, about the pre-deposition idler roller 66b, through the gas gate 58c and the first deposition chamber 28, through the gas gate 58d and the second deposition chamber 30, through the gas gate 58e and the third deposition chamber 32, through the gas gate 58f and the intermediate isolation chamber 40, through the gas gate 58g and the fourth deposition chamber 34, through the gas gate 58h and the fifth deposition chamber 36, through the gas gate 58i and the sixth deposition chamber 38, through the gas gate 58j and the post-deposition, substrate-directing chamber 44, about the post-deposition idler roller 66c, through the slot 68a and the cool-down chamber 48, through the slot 68b and the take-up chamber 52, about the take-up idler roller 66d, about the take-up side idlers 62j and 62k, to the automatic threader take-up roller 62f. The belt 62g includes a pair of relatively thin, elongated, spacedly connected strands 62*l* and 62*m*. The strands 62*l* and 62*m* of the belt 62*g* are preferably connected by only three transverse attachment links 62*n*, 62*p* and 62*q*. The length of the attachment links 62*n*, 62*p* and 62*q* must be greater than the width of the web of substrate material 11 so that the spaced strands 62*l* and 62*m* will not cover or mask any portion of the web of substrate material 11 as that web travels through the deposition chambers of the apparatus 26.

In the operation of the automatic threader assembly 62, the leading edge of the web of substrate material 11 on the core 60*a* is threaded over attachment link 62*n*, under attachment link 62*p*, around attachment link 62*q*, back under attachment link 62*p* and taped or otherwise secured to itself adjacent attachment link 62*n*. The threader supply motor 62*a* and the threader take-up motor 62*d* are then activated and the attachment links 62*n*, 62*p* and 62*q* on the flexible belt 62*g* are moved from a position adjacent the automatic threader supply roller 62*c*, proximate the supply mandril 60*b*, through the multiple chambers of the assembly 26 to a position adjacent the automatic threader take-up roller 62*f*, proximate the take-up mandril 60*d*. Upon reaching the take-up roller 62*f*, the leading edge of the web of substrate material 11 is removed from the automatic threader assembly 62 and secured to the substrate take-up core 60*c* on the take-up mandril 60*d*. In this manner, the web of substrate material 11 is automatically threaded from a position adjacent the supply mandril 60*b* in the supply chamber 50, through the multiple chambers of the assembly 26, to a position adjacent the take-up mandril 60*d* in the take-up chamber 52. The flexible belt 62*g* may now either be wound about the threader take-up roller 62*f* or returned to and wound about the threader supply roller 62*c*. While it is not important about which roller the belt 62*g* is wound, it is important the attachment links 62*n*, 62*p* and 62*q* be wound about one of the rollers 62*f* or 62*c* so that said links do not mask any portion of the web of substrate material 11 during the process of deposition.

G. The Automatic Web Steering Assembly

It is desirable that the post-deposition idler roller 66*c* be "steerable". To accomplish such steering, a servo control, operatively connected to the steering mechanism of the steering idler roller 66*c* is adapted to move the idler roller 66*c* a few thousandths of an inch, so as to prevent adjacent layers of the web of substrate material 11 from telescoping as the substrate 11 is wound about the take-up core 60*c* on the take-up mandril 60*d*.

Figure 9:
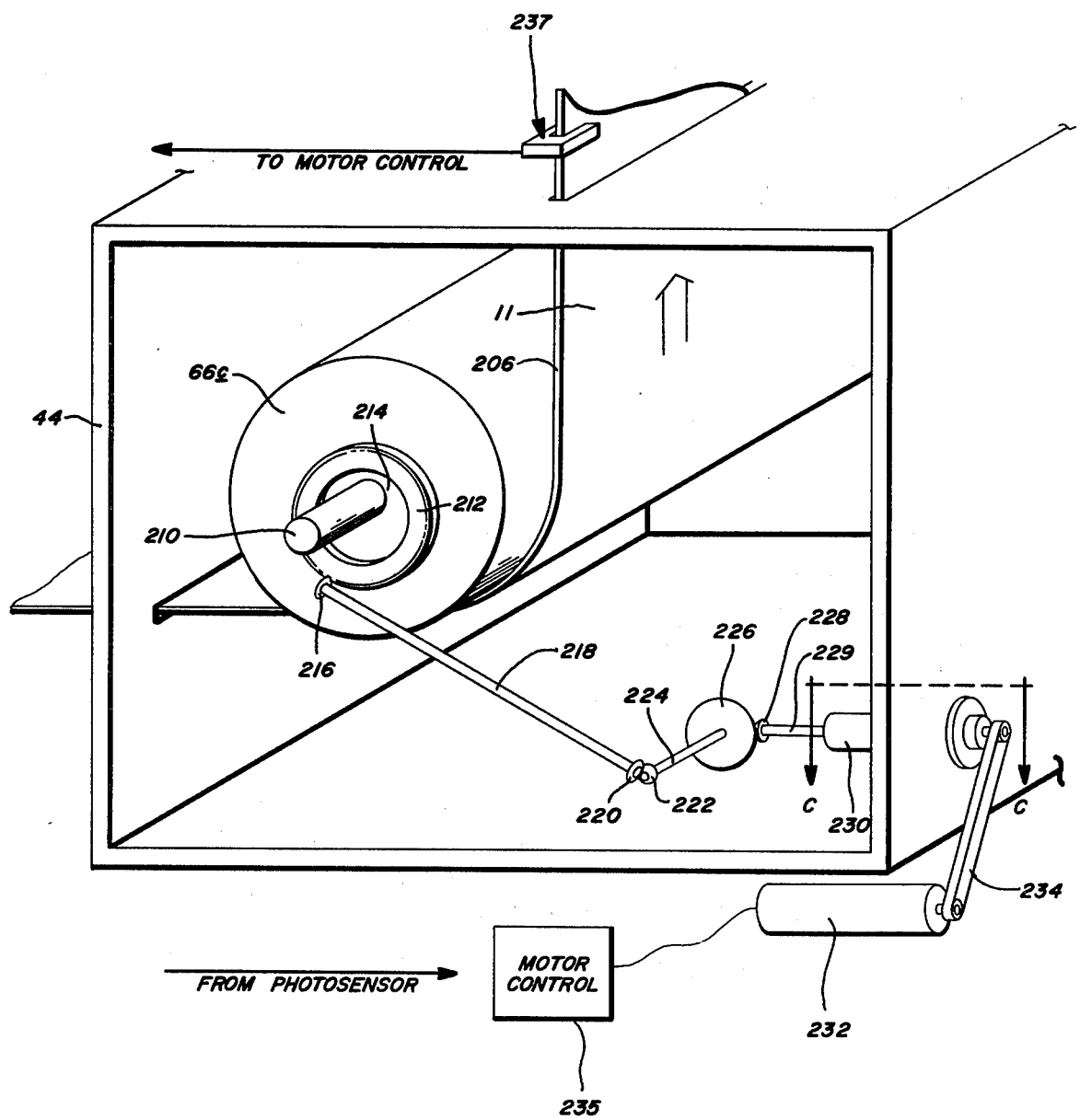
FIG. 9 is a perspective view illustrating a deposition chamber in which the automatic steering assembly of the present invention is operatively disposed to adjust the position of a web of substrate material relative to a rotating idler roller.

More particularly, FIG. 9 shows the elements used to sense and correct the position of the advancing web of substrate material 11 so as to assure proper tracking of the web 11 through the deposition chambers and onto the take up core 60*c*. The web of substrate material 11 is steered by changing the tension at one edge 206 thereof, relative to the opposite edge, by means of a steering roller 66*c*. For reasons of economy and simplicity of design, the steering roller 66*c* also functions as the post deposition turning roller illustrated in FIG. 3. However, it may alternately be any member over which the web of substrate material 11 passes. The steering roller 66*c*, turns upon a shaft 210 which is supported by a bearing 214 located eccentrically within a worm gear assembly 212. Rotation of the worm gear assembly 212 moves the eccentric bearing 214, located therein, in a substantially linear direction which is generally parallel to the direction of web 11 movement. This movement of the eccentric bearing 214 pivots the steering roller 66*c* thereby increasing or relieving stress at the edge 206 of the web 11 trained thereabout.

Rotation of the worm gear assembly 212 is accomplished by means of a worm 216 engaged therewith. The worm 216 is turned by a first shaft 218 having at the end thereof opposite the worm 216 a first bevel gear 220. The first bevel gear 220 engages a second bevel gear 222 which is attached to a second shaft 224. The second shaft 224 has a large bevel gear 226, on the end thereof opposite the second bevel gear 222, which meshes with a small bevel gear 228, for reducing the speed of rotation. The small bevel gear 228 is attached to a shaft 229 of a rotary vacuum seal 230 which is adapted to provide a vacuum tight seal for connecting an externally located servo-motor 232 to the drive train of the worm gear assembly 212. The servo-motor 232 is connected to the rotary vacuum seal 230 by means of a drive belt 234, although such connection could be accomplished by other conventional mechanical assemblies. The servo-motor 232 is controlled by a servo-motor controller 235 which generates servo-motor control signals in response to the output it receives from a photosensor assembly 237.

In the preferred embodiment, the photosensor assembly 237 is located approximately (1) 18 inches upstream of the steering roller 66*c* and (2) in close proximity to the edge 206 of the advancing web of substrate material 11. By sensing the location of the edge 206 of the advancing web 11, the assembly 237 is adapted to relay a signal to the servo-motor controller 235. As will be seen from the description which follows, the signal corresponds to the position of the edge 206 of the web 11 relative to the photosensor assembly 237.

Figure 9A:
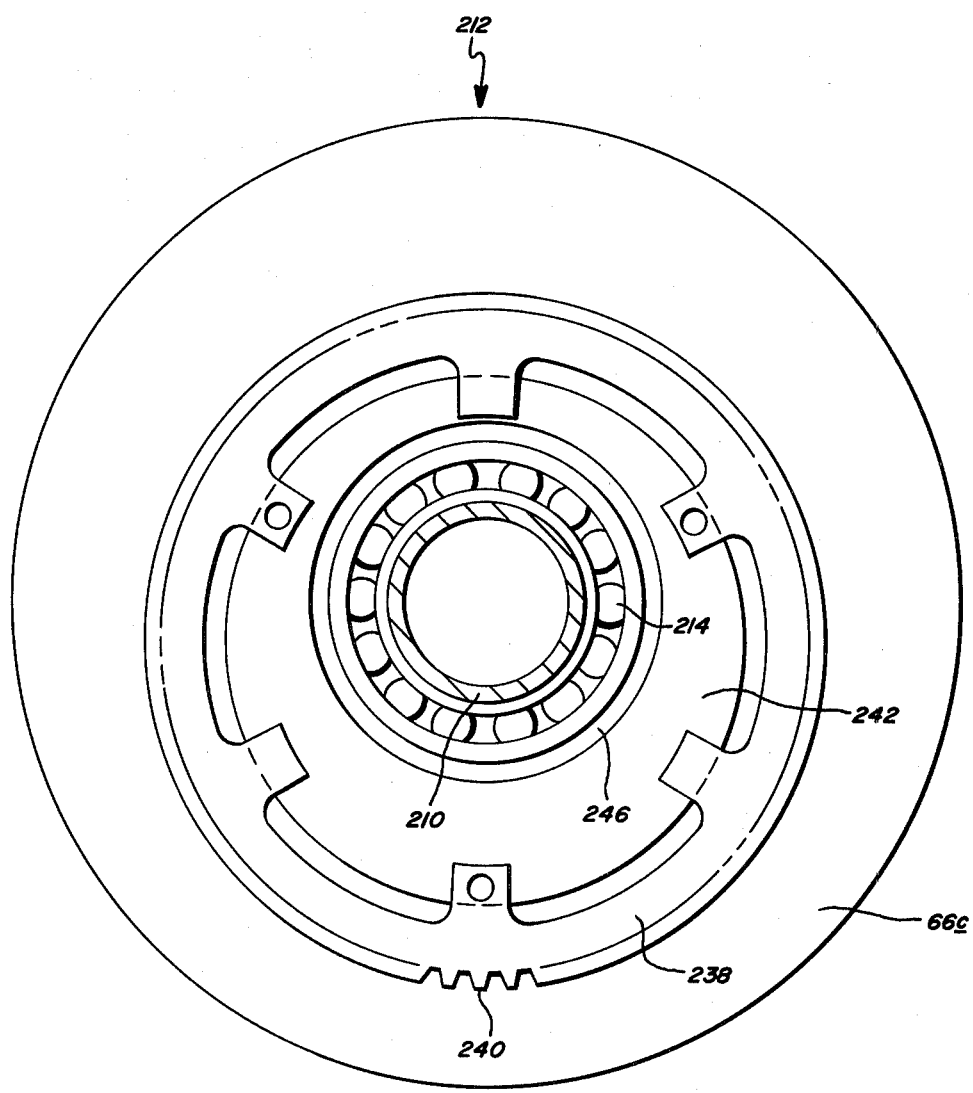
FIG. 9A is an enlarged front elevational view depicting details of the worm gear and eccentric bearing of the automatic steering assembly of FIG. 9.

Referring now to FIG. 9A, details of the worm gear assembly 212 is depicted. The gear assembly 212 pivots the steering roller 66*c* to increase or relieve tension upon the edge 206 of the web of substrate material 11, thereby performing the aforementioned steering operation. More specifically, the worm gear assembly 212 consists of a worm gear 238 having gear teeth 240 on the outer circumference thereof. Rigidly attached to the inner circumference of the worm gear 238 is an adapter plate 242 having a bearing 214 retained eccentrically therein by means of a bearing retainer 246. The steering roller shaft 210, attached to the steering roller 66*c*, is supported by the bearing 214. While FIG. 9A shows the bearing 214 as a ball bearing, other conventional bearings or retainers may also be employed without departing from the spirit or scope of this invention.

Figure 9B:
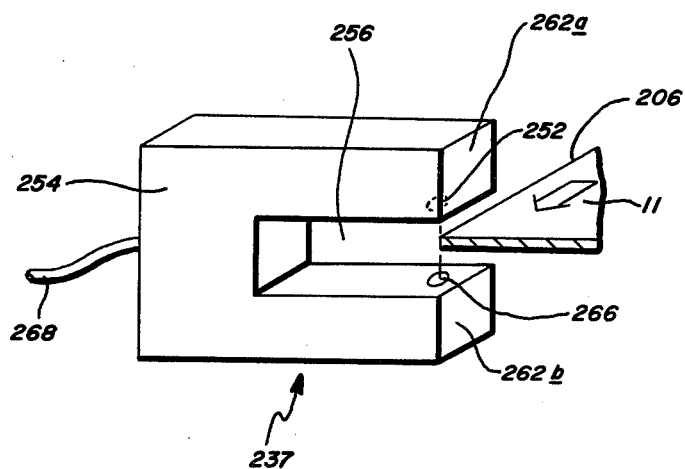
FIG. 9B is an enlarged, fragmentary perspective view of a portion of the steering assembly of FIG. 9 illustrating the positioning of the sensor assembly relative to the advancing web of material.

FIG. 9B illustrates the photosensor assembly 237, referred to hereinabove, which is adapted to ascertain the position of the edge 206 of the web of substrate material 11 relative to the steering roller 66*c*. The photosensor assembly 237 consists of a U-shaped housing 254 between the legs 262*a* and 262*b* of which the edge 206 of the advancing web 11 passes. The legs 262*a* and 262*b* of the photosensor housing 254 include the active photosensor elements. Specifically, located in the leg 262*a* is a light source 252, such as an incandescent bulb or a light emitting diode. Located in the other leg 262*b* is a photoreceptor 266, such as a photovoltaic cell, a photoconductive cell, or a phototransistor. The photoreceptor 266 provides an electrical signal corresponding to the amount of light incident thereon from the light source 252. Obviously, the amount of light incident upon the photoreceptor 266 depends upon the position of the edge 206 of the web of material 11 relative to said photoreceptor 266. If the edge 206 completely masks the photoreceptor 266, the resultant signal will be minimized. Alternatively if the edge 206 does not cover any portion of the photoreceptor 266, the resultant signal will be maximized. The preferred photoreceptor 266 of this invention, one manufactured by Advanced Web Systems of Rockford, Ill. is capable of providing ten discrete signal levels between the maximum and the minimum signal levels. It may also be desirable to include one or more lenses (not shown) in the photosensor assembly 237. These lenses would be associated with either the light source 252, the photoreceptor 266, or both, to provide a uniform beam of light therebetween.

The initial position of the photosensor assembly 237 relative to the web of substrate material 11 is such that the edge 206 of the web 11 masks about one-half of the window of light which the photoreceptor cell 266 is capable of receiving from the source 252, thereby providing a preselected reference signal relative to which subsequent signals may be measured. The preselected reference signal indicates a proper "home" position of the advancing web 11. If the web 11 deviates from this home position, a signal corresponding to the deviation of the web from the home position will be generated and forwarded to the servo-motor controller 235, shown in FIG. 9, which then controls the servo-motor 232.

Figure 9C:
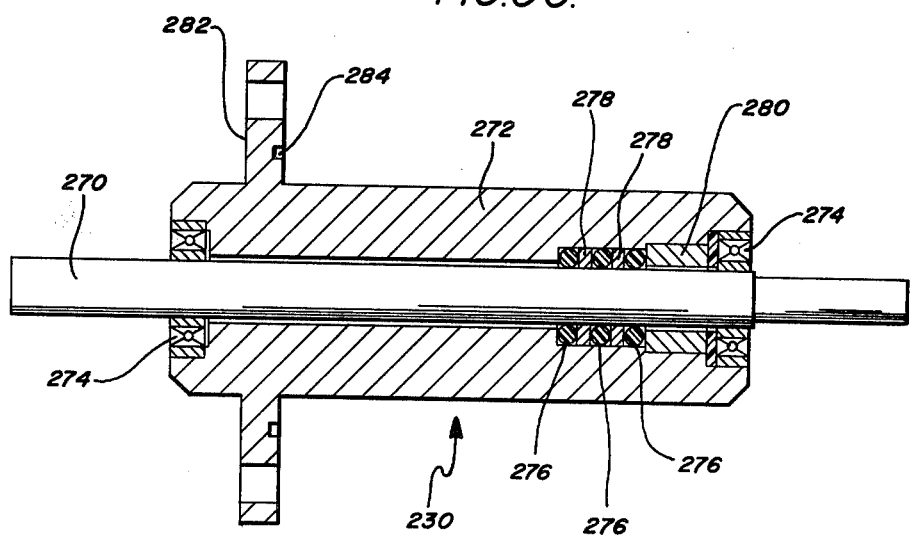
FIG. 9C is an enlarged cross-sectional view taken along line C—C of FIG. 9 detailing the arrangement of the rotary vacuum seal of the steering assembly.

FIG. 9C depicts a cross-section of the rotary vacuum seal assembly shown at 230 in FIG. 9. The rotary seal 230 operatively links the servo-motor 232 to the mechanical elements in the deposition chamber 44. The rotary seal 230 consists of a shaft 270 passing through a housing 272 which, in turn, physically interconnects with the vacuumized corner chamber of the deposition apparatus 26. The shaft 270 is a cylindrical member made of stainless steel or other rigid, durable material. The housing 272 includes a set of bearings 274 supporting the shaft 270 at both ends thereof, those points at which the shaft passes through the housing 272. While ball bearings are illustrated in the drawing, these bearings 274 can also be roller bearings, journal bearings or the like. Located within the housing 272 is a vacuum seal formed by a plurality of spaced flexible O-rings 276 which provide a vacuum tight seal while providing free rotation of the shaft 270. These O-rings 276 can be made of natural rubber, or synthetic materials such as Viton (a fluorocarbon elastomer) supplied by the Federal Mogol Corporation. It is desirable that the O-rings 276 be spaced from one another by spacers 278 which are dimensioned such that they do not bind the shaft 270. One preferred material for spacers is a Teflon (a registered trademark) flurocarbon polymer.

Three O-rings have been found to provide the dual desirable result of (1) sufficient vacuum tightness and (2) frictional resistance to shaft rotation. It has also been found that the O-rings 276 should be compressed to about 90% of their original size and that this compression should be provided by the housing 272 rather than the shaft 270. That is to say, the internal diameter of the O-rings 276 should correspond to the external diameter of the shaft 270, and the external diameter of the O-rings 276 should be slightly greater than the diameter of the cavity in the housing 272 in which they are situated. The O-rings 276 and the spacers 278 are held in place inside of the housing 272 by a retaining ring 280 made of a durable low friction material such as Teflon. In use, the rotary feed-through is attached to the housing of the vacuum chamber by a flange 282 formed integrally with the body of the housing 272. This flange 282 includes a peripheral O-ring groove 284 to complete the vacuum seal of the vacuum chamber.

In operation, the photosensor assembly 237 senses the position of the edge 206 of the advancing web of substrate material 11 and generates an electrical signal indicative of that position. This signal is communicated by the photosensor 236 to the motor controller 235 which rotates the servo-motor 232 in either a clockwise or counterclockwise direction depending upon the position of the edge 206 of the web 11 relative to its home position on the roller 66c. The rotational motion is communicated to the drive train of the steering mechanism located inside the chamber 44 by the rotary vacuum seal 230. The rotational motion turns the worm 216 which, in turn, turns the worm gear assembly 212, thereby pivoting the axis of rotation of the steering roller 66c. This motion changes the tension on the edge 206 of the web 11, thus steering the web 11 and thereby eliminating "telescoping" as the web 11 is wound about the take-up core 60c.

H. The Loading and Take-up Mandrils

Both, the circumference of the substrate supply mandril 60b and the circumference of the substrate take-up mandril 60d may be made expandable. In this manner, the core 60a about which the predeposition web of substrate material 11 is wound, can be securely fastened to the supply mandril 60b by expanding the circumference of the supply mandril 60b. Similarly, removal of the take-up core 60c about which the post-deposition web of substrate material 11 is wound can be accomplished by simply reducing the circumference of the take-up mandril 60d. Obviously, other conventional loading and removal systems can be employed.

Once the web of substrate material 11 is (1) automatically threaded through the chambers of the assembly 26, (2) secured to the take-up core 60c on the take-up mandril 60d, and (3) the leading edge of the interleaf sheeting 64d from between adjacent layers of the substrate 11 wound about the supply core 60a on the supply mandril 60b is secured to interleaf removal roller 64a, and (4) the leading edge of the fresh interleaf sheeting 64d reattached from interleaf supply core 64e to the substrate 11 at the take-up core 60c on the take-up mandril 60d; doors or other openings, not illustrated, into the supply chamber 50 and the take-up chamber 52 are sealed. The multiple chambers of the assembly 26 are now operatively interconnected in an air-tight enclosure wherein (1) air and/or other ambient contaminants from the environment cannot leak into the assembly 26, and (2) reaction gas mixtures selectively introduced into the various chambers of the apparatus 26 can not escape to the environment.

I. Heating The Substrate Material

FIG. 4 is a diagrammatic representation of the multiple chambers which combine to form the glow discharge deposition apparatus 26 of the present invention showing, as described hereinabove, the gas gates 58a–58i, the web of substrate material 11 extending from the supply core 60a on the supply mandril 60b to the take-up core 60c on the take-up mandril 60d and the idler rollers 66a, 66b, 66c, 66d adapted to change the direction of travel of the substrate 11. Further, FIG. 4 adds, diagrammatically, the holders for heating elements 86 and the heater controls 88 and 90 necessary to heat the chambers of the deposition apparatus 26 for warming, to the preselected operating temperature, the web of substrate material 11 passing therethrough.

It is desirable that the gas gates 58a–58i also be heated. If the substrate 11 is allowed to cool as it passes between the various chambers of the assembly 26, the substrate 11 would wrinkle, or canoe, or waffle, thereby making it virtually impossible to deposit semiconductor layers of uniform thickness thereonto. Further, if the substrate 11 were allowed to cool between chambers, it would be more likely to collect contaminants from the interior walls of those chambers. Although the gas gates 58a–58i will be described hereinafter as being equipped with rod-type resistance heaters and the deposition chambers will be described as being equipped with infrared lamps arranged to achieve an optimum heating profile (a constant temperature across the transverse width of the substrate 11), any type of known heating elements capable of providing uniform heating of the web of substrate material 11 and the chambers may be used without departing from the spirit and scope of the present invention.

Although not illustrated for the gas gates 58a–58i of FIG. 4, it is to be understood that the bottom plate 70 and top plate 82 of the gas gate 58, shown in FIG. 3A, include a plurality of these rod-type resistance heaters, such as 84. Further, a holder for a plurality of heating elements 86a is provided in the cleaning chamber 46; a pair of holders for a plurality of heating elements 86b is provided about the predeposition idler roller 66b in the pay-off, substrate-directing chamber 42; a holder for a plurality of heating elements 86c is provided in the first deposition chamber 28; a holder for a plurality of heating elements 86d is provided in the second deposition chamber 30; a holder for a plurality of heating elements 86e is provided in the third deposition chamber 32; a holder for a plurality of heating elements 86f is provided in the fourth deposition chamber 34; a holder for a plurality of heating elements 86g is provided in the fifth deposition chamber 36; and a holder for a plurality of heating elements 86h is provided in the sixth deposition chamber 38. Additionally, a holder for a plurality of heating elements 86i may be provided about post-deposition idler roller 66c in the post-deposition, substrate-directing chamber 44, and a holder for a plurality of heating elements 86j may be provided in the cool-down chamber 48. The number and spacing of the heating elements in the holders 86a–86i in the chambers of the apparatus 26 is dependent upon the following system parameters: (1) maintaining a uniform substrate temperature of 200–300 degrees centigrade from the cleaning chamber 46 through the pay-off, substrate-directing chamber 42, the deposition chambers 28, 30, 32, the intermediate isolation chamber 40, and the deposition chambers 34, 36 and 38; (2) a cool-down temperature of approximately 100 degrees at the take-up mandril 60d in the take-up chamber 52; and (3) an uncontrolled temperature in the supply chamber 50.

Although, only shown connected to the holder for heating elements 86a in the cleaning chamber 46, it is to be understood that each of the other holders for heating elements 86b–86j, in the other chambers of the apparatus 26, are connected to individual thermocoupler controllers such as 90 and power switches such as 88. Each power switch 88 is in turn connected to the main power supply. The thermocoupler controllers 90 are adapted to measure the temperature of the substrate 11 and compare that measurement with a preselected temperature. The thermocoupler controllers 90 are adapted to activate the power switches 88 to which they are connected for energizing the heating elements 86a–86j in the event the substrate 11 in any chamber falls below the preselected temperature. The thermocoupler controllers 90 are also adapted to deactivate the power switches to which they are connected for deenergizing the heating elements 86a–86j when the substrate 11 has been warmed to or above the preselected temperature.

J. Producing Plasma In The Deposition Chambers

Figure 5:
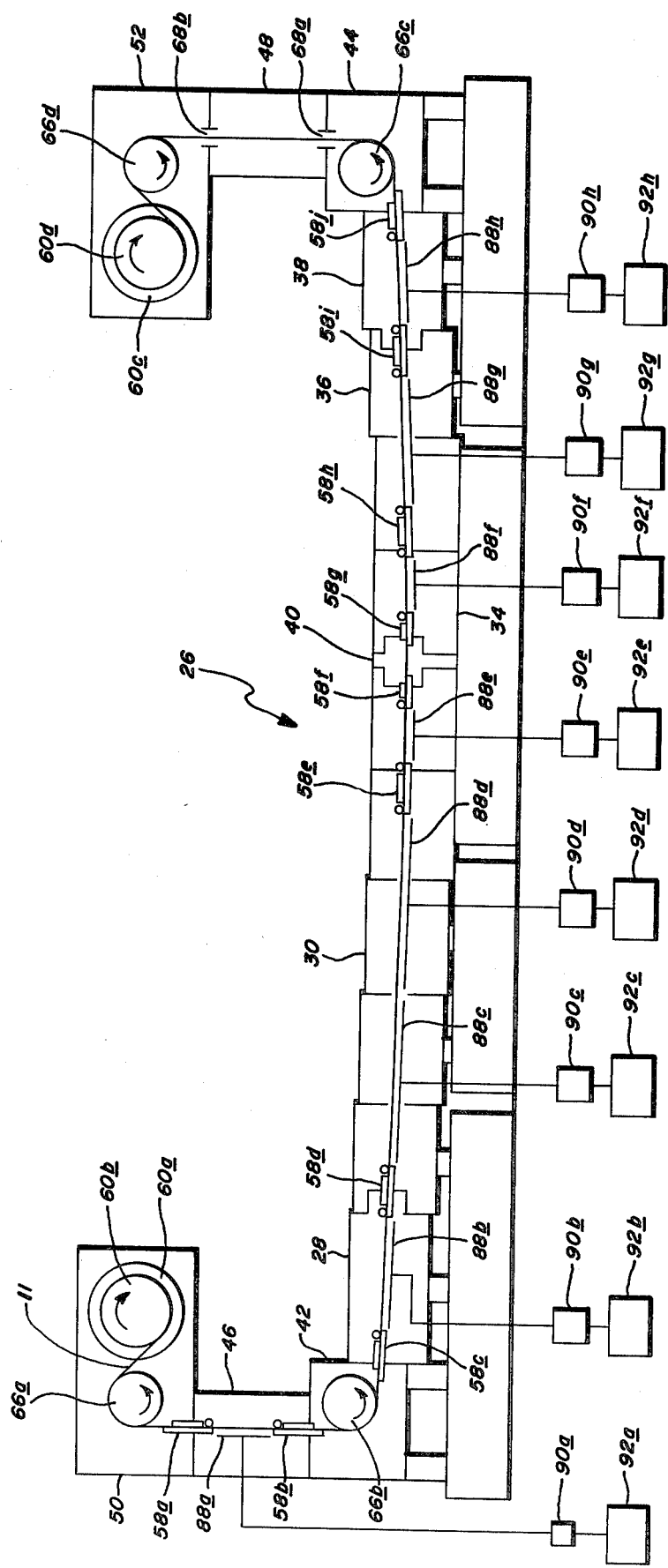
FIG. 5 is a diagrammatic representation of the multiple chamber deposition apparatus of the present invention showing the isolation mechanisms, the substrate stretching from the supply chamber to the take-up chamber, and the cathodes and associated power generation equipment within the deposition chambers for depositing successive plasma layers onto the surface of the substrate.

FIG. 5 is a diagrammatic representation of the multiple chambers which combine to form the glow discharge deposition apparatus 26 of the present invention showing, as described hereinabove: the gas gates 58a–58i; the web of substrate material 11 extending from the supply core 60a on the supply mandril 60b to the take-up core 60c on the take-up mandril 60d and the idler rollers, 66a, 66b, 66c, 66d adapted to change the direction of travel of the web of substrate material 11. Further, FIG. 5 adds diagrammatically, the cathodes, generally 88, and the associated power generation equipment for generating a plasma and depositing successive semiconductor layers onto the surface of the web of substrate material 11.

Although not illustrated in FIG. 5, the holders for the heating elements 86, described hereinabove with reference to FIG. 4, are positioned adjacent to and on one side of the web of substrate material 11 passing through the chambers of the deposition apparatus 26. More particularly, the holder for heating elements 86a is positioned adjacent to and on one side of the substrate 11 passing through the cleaning chamber 46, the holders for the heating elements 86c is positioned adjacent to and on one side of the substrate 11 passing through the first deposition chamber 28, the holder for the heating elements 86d is positioned on one side of and adjacent to the substrate 11 passing through the second deposition chamber 30, the holder for the heating elements 86e is positioned adjacent to and on one side of the substrate 11 passing through the third deposition chamber 32, the holder for the heating elements 86f is positioned adjacent to and on one side of the substrate 11 passing through the fourth deposition chamber 34, the holder for the heating elements 86g is positioned adjacent to and on one side of the substrate 11 passing through the fifth deposition chamber 36, and the holder for the heating element 86h is positioned adjacent to and on one side of the substrate 11 passing through the sixth deposition chamber 38.

The cathodes, shown in FIG. 5 as 88a–88h, are located in the chambers of the deposition apparatus 26 on the side of the web of substrate material 11 opposite the holders for the heating elements 86. More particularly, cathode 88a is positioned adjacent to and on the side of the substrate 11 opposite from the holder for the heating elements 86a in the cleaning chamber 46, the cathode 88b is positioned adjacent to and on the side of the substrate 11 opposite from the holder for the heating elements 86c in the first deposition chamber 28, the cathodes 88c and 88d are positioned adjacent to and on the side of the substrate 11 opposite from the holder for heating elements 86d in the second deposition chamber 30, the cathode 88e is positioned adjacent to and on the side of the substrate 11 opposite from the holder for the heating elements 86e in the third deposition chamber 32, the cathode 88f is positioned adjacent to and on the side of the substrate 11 opposite from the holder for the heating elements 86f in the fourth deposition chamber 34, the cathode 88g is positioned adjacent to and on the side of the substrate 11 opposite from the holder for the heating elements 86g in the fifth deposition chamber 36, and the cathode 88h is positioned adjacent to and on the side of the substrate 11 opposite from the holder for the heating elements 86h in the sixth deposition chamber 38.

Note that the second deposition chamber 30 spans approximately 100 inches in length. If a single cathode of that length was operatively disposed therein, the circulating current would be great with correspondingly large power losses due to circuit resistance even with the addition of complex tuning methods. Accordingly, a plurality of smaller cathodes are employed. Although, for the sake of simplicity, only two cathodes, 88c and 88d, are illustrated in FIG. 5, it should be understood that the number may be greater, and in practice, three such cathodes are spacedly disposed within that intrinsic deposition chamber 30. While the spacing between contiguous cathodes in a signle deposition chamber was thought to be critical, it was surprisingly determined that the gap between those contiguous cathodes did not adversely affect the quality of the semiconductor layer deposited. Specifically, the semiconductor material deposited by three spaced cathodes was of substantially identical quality as the semiconductor material deposited by a single elongated cathode. Likewise, the gap or spacing between the substrate 11 and the cathodes 88 is not critical. Good quality semiconductor layers, are deposited if the cathodes 88a–88h are located within a range of 1 to 2 inches from the substrate 11.

Figure 11:
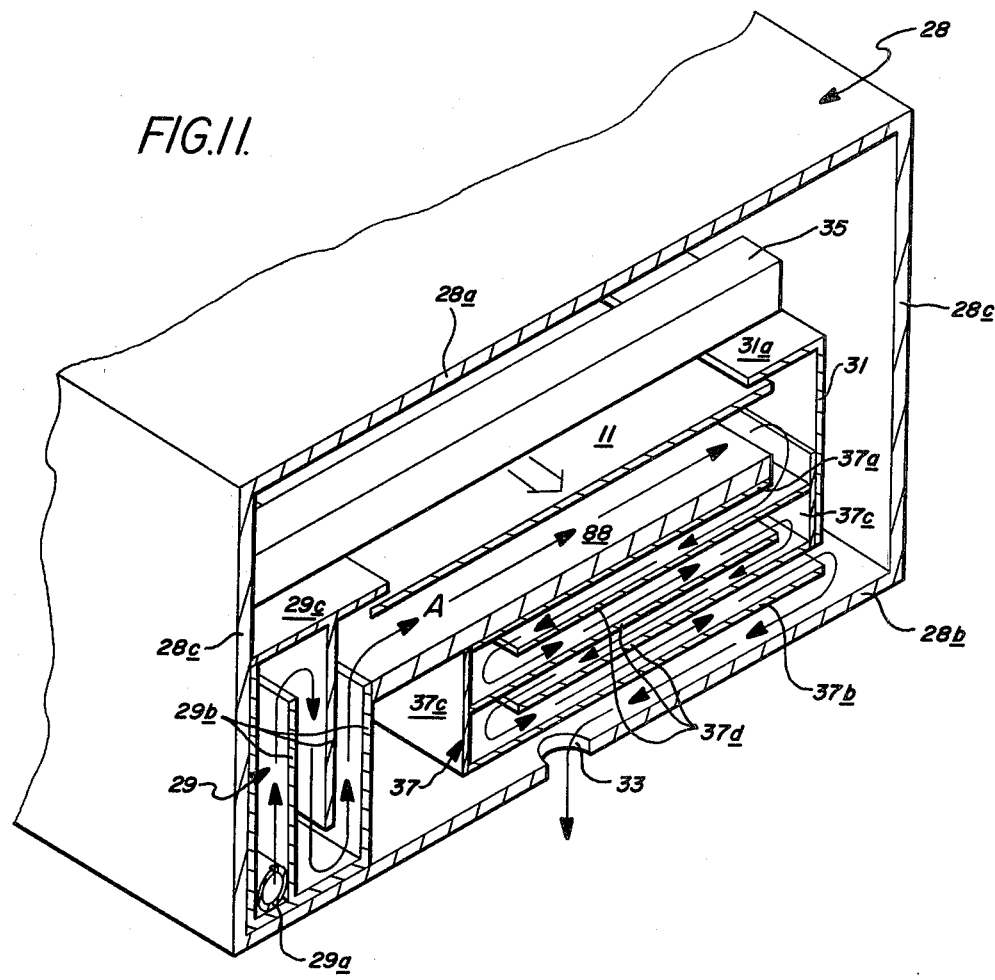
FIG. 11 is an enlarged cross-sectional view of the interior of a glow discharge deposition chamber, illustrating the flow of the reaction gas mixture and the post-deposition powder trap.

As shown in FIG. 11 and as fully described hereinafter, each of the deposition chambers may be provided with a shield at least partially surrounding each cathode for substantially confining the process gas mixtures to the cathode region. Further the reaction gas introduction system will include some type of baffle arrangement for (1) completely mixing the reaction gas mixture upstream of the plasma region, and (2) substantially providing for the uniform flow of the reaction gases. Both of the foregoing concepts are adequately disclosed in and incorporated herein from commonly assigned U.S. patent application Ser. No. 437,075, filed Oct. 27, 1982, and entitled "Process Gas Introduction, Confinement And Evacuation System For Glow Discharge Deposition Apparatus".

As previously discussed hereinabove, the length of the cathodes 88 is one of the factors which determines the thickness of the semiconductor layers deposited on the substrate 11, as the substrate 11 passes through the deposition chambers. By maintaining the other operating parameters of the deposition apparatus 26 which have been discussed hereinabove or will be discussed hereinafter, constant; (such as the speed of travel of the web of substrate material 11 from the supply chamber 50 to the take-up chamber 52, the flow rates of the reaction gas mixtures entering the chambers, and the vacuum pressures within the chambers) the following lengths of the cathodes produce the following thicknesses of alloy layers: a cathode of approximately 30 inches in the first deposition chamber 28 will produce a p-type semiconductor layer 100–200 angstroms thick; a total cathode length of approximately 100 inches in the second deposition chamber 30 will produce an intrinsic semiconductor layer 2,000–3,000 angstroms thick; a cathode length of approximately 12 inches in the third deposition chamber 32 will produce an n-type semiconductor layer 50–100 angstroms thick; a cathode length of approximately 12 inches in the fourth deposition chamber 34 will produce a p-type semiconductor layer 50–150 angstroms thick; a cathode length of approximately 30 inches in the fifth deposition chamber 36 will produce an intrinsic semiconductor layer 1000 angstroms thick; and a cathode length of approximately 12 inches in the sixth deposition chamber 38 will produce an n-type alloy layer approximately 50–100 angstroms thick. Further, the preferred length of the cathode 88a in the cleaning chamber 46 is approximately 15 inches.

Energization of the reaction gas mixtures introduced into the deposition chambers is necessary for the production of the ionized plasma adapted to be deposited onto the substrate 11. Accordingly, tuning networks (hereinafter referred to as "tuners 90") are employed to provide matching networks which insure that the power supplied by the power supplies 92 is channelled to the plasma. More particularly, a tuner 90a is provided to regulate a radio frequency power supply 92a for energizing cathode 88a in the cleaning chamber 46; a tuner 90b is provided to regulate a radio frequency power supply 90b for energizing cathode 88b in the first deposition chamber 28; a tuner 90c is provided to regulate a radio frequency power supply 92c for energizing the first cathode 88c in the second deposition chamber 30 and a tuner 90d is provided to regulate a radio frequency power supply 92d for energizing the second cathode 88d in the second deposition chamber 32; a tuner 90e is provided to regulate a radio frequency power supply 92e for energizing cathode 88e in the third deposition chamber 34; a tuner 90f is provided to regulate a radio frequency power supply 92f for energizing a cathode 88f in the fourth deposition 36; a tuner 90g is provided to regulate a radio frequency power supply 92g for energizing a cathode 88g in the fifth deposition chamber 36; and a tuner 90h is provided to regulate a radio frequency power supply 92h for energizing a cathode 88h in the sixth deposition chamber. In the preferred embodiment, the radio frequency power supplies 92b–92h and the tuners 90b–90h are set to provide approximately thirteen (13.56) mega-Herz of power to the cathodes 88b–88h in the deposition chambers and the tuner 90a and the power supply 92a are set to provide ten kilo-Herz of power to the cathode 88a in the cleaning chamber 46.

Although the foregoing description dealt specifically with the use of radio frequency to generate the plasma, the apparatus of the present application includes all forms of glow discharge deposition. Specifically, the use of microwave frequency to generate a plasma and deposit semiconductor material onto a substrate is well within the scope of the present invention. Such deployment of microwaves is disclosed in commonly assigned U.S. patent application Ser. No. 441,280, filed Nov. 12, 1982, entitled "An Improved Apparatus For The Manufacture Of Photovoltaic Devices".

K. Introducing The Reaction Gas Mixtures

Figure 6:
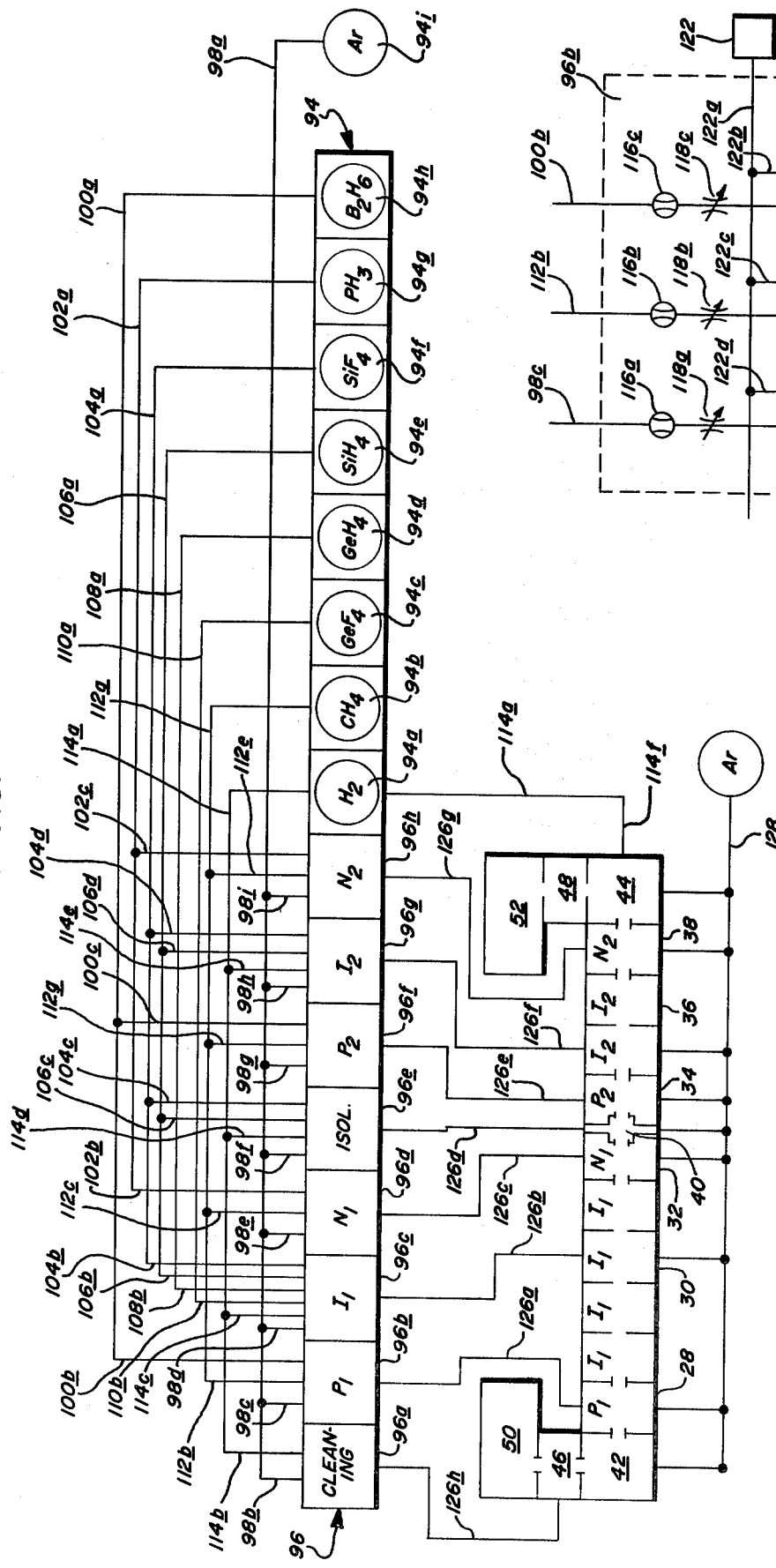
FIG. 6 is a diagrammatic representation of the multiple chamber deposition apparatus of the present invention illustrating the feed conduits and the valving assemblies employed to proportion and introduce the reaction gases into the chambers.

FIG. 6 is a diagrammatic representation of the multiple chambers which combine to form the glow discharge deposition apparatus 26 of the present invention. Added to the multiple chambered apparatus, described hereinabove, are the feed conduits and the valving assemblies which are employed to introduce the preselected mixtures and proportions of reaction gases into the reaction chambers of the deposition apparatus 26.

For the gas flow illustration of FIG. 6, the abbreviation "$P_1$" indicates the first p-type semiconductor layer adapted to be deposited onto the substrate 11 in the first deposition chamber 28, the abbreviation "$I_1$" indicates the intrinsic semiconductor layer adapted to be deposited atop the $P_1$ layer in the second deposition chamber 30, the abbreviation "$N_1$" indicates the first n-type semiconductor layer adapted to be deposited atop the intrinsic layer in the third deposition chamber 32, the abbreviation "$P_2$" indicates the second p-type semiconductor layer adapted to be deposited atop the $N_1$ layer in the fourth deposition chamber 34, the abbreviation "$I_2$" indicates the second intrinsic semiconductor layer adapted to be deposited atop the $P_2$ layer in the fifth deposition chamber 36, and the abbreviation "$N_2$" indicates the second n-type semiconductor layer adapted to be deposited atop the intrinsic layer in the sixth deposition chamber 38. By employing the foregoing number and arrangement of deposition chambers, the apparatus 26 is adapted to deposit six successive amorphous semiconductor alloy layers onto the substrate 11 and previously deposited alloy layers, wherein the intrinsic semiconductor layers deposited in deposition chambers 30 and 36 differ in composition from the semiconductor layers deposited in the other deposition chambers by the substantial absence of at least the p-type and n-type dopant elements. As previously stated, it is essential that the intrinsic semiconductor layers deposited onto the substrate 11 be of high purity in order to produce high efficiency photovoltaic devices. To that end, the p-type and n-type dopant gas mixtures introduced in the first, third, fourth and sixth deposition chambers cannot be permitted to enter the intrinsic deposition chambers 30 and 36. The isolation of the dopant reaction gas mixtures must be sufficient to provide a ratio of at least $10^{-3}$ in dopant concentration between the intrinsic deposition chambers 30 and 36 and the dopant deposition chambers 28, 32, 34 and 38. It is also imperative that the p-type and n-type dopant reaction gas mixtures in the third and fourth deposition chambers 32 and 34 be isolated from one another.

In practice, and in accordance with the preferred embodiment of the present invention, at least one reaction gas mixture is provided which includes the intrinsic material which is common to all of the deposited semiconductor layers. While it is preferred that the intrinsic semiconductor layer be formed of an amorphous silicon alloy, an intrinsic layer formed of an amorphous germanium alloy is well within the scope of the present invention. Although not limited thereto, the reaction gases combining to form the intrinsic material can include silicon tetrafluoride gas ($SiF_4$) plus hydrogen gas, silicon tetrafluoride gas plus silane gas ($SiH_4$), silicon tetrafluoride gas alone, or silane gas alone. Alternatively, amorphous germanium semiconductor alloy layers may be deposited on the substrate 11. For example, the intrinsic gases could include germanium tetrafluoride gas ($GeF_4$) plus hydrogen gas, germanium tetrafluoride gas plus silane gas, germanium tetrafluoride gas alone, or germane gas ($GeH_4$) alone. The intrinsic mixture could also include any combination or all of the aforementioned gases without departing from the spirit of this invention. An inert gas such as argon may also be mixed with the other intrinsic gases for introduction into the intrinsic deposition chambers 30 and 36. The p-type layers are formed by introducing argon, diborane ($B_2H_6$) and methane ($CH_4$) into the p-type deposition chambers 28 and 34. The n-type alloy layers are formed by introducing argon, methane and posphine ($PH_3$) into the n-type deposition chambers 32 and 38. The same reaction gases as are introduced into the intrinsic deposition chambers 30 and 36 are also introduced into the isolation chamber 40; argon and hydrogen gases are introduced into the cleaning chamber 46 through the pay-off, substrate-directing chamber 42; and nitrogen gas is introduced into all of the chambers for the purpose of purging the chambers of the apparatus 26 after the amorphous semiconductor layers have been deposited on the entire web of substrate material 11. Further, argon gas will be introduced at the leading end of the dopant chamber gas gates 58d, 58e, 58h and 58i to accomplish the argon sweeping process, discussed supra.

Figure 8:
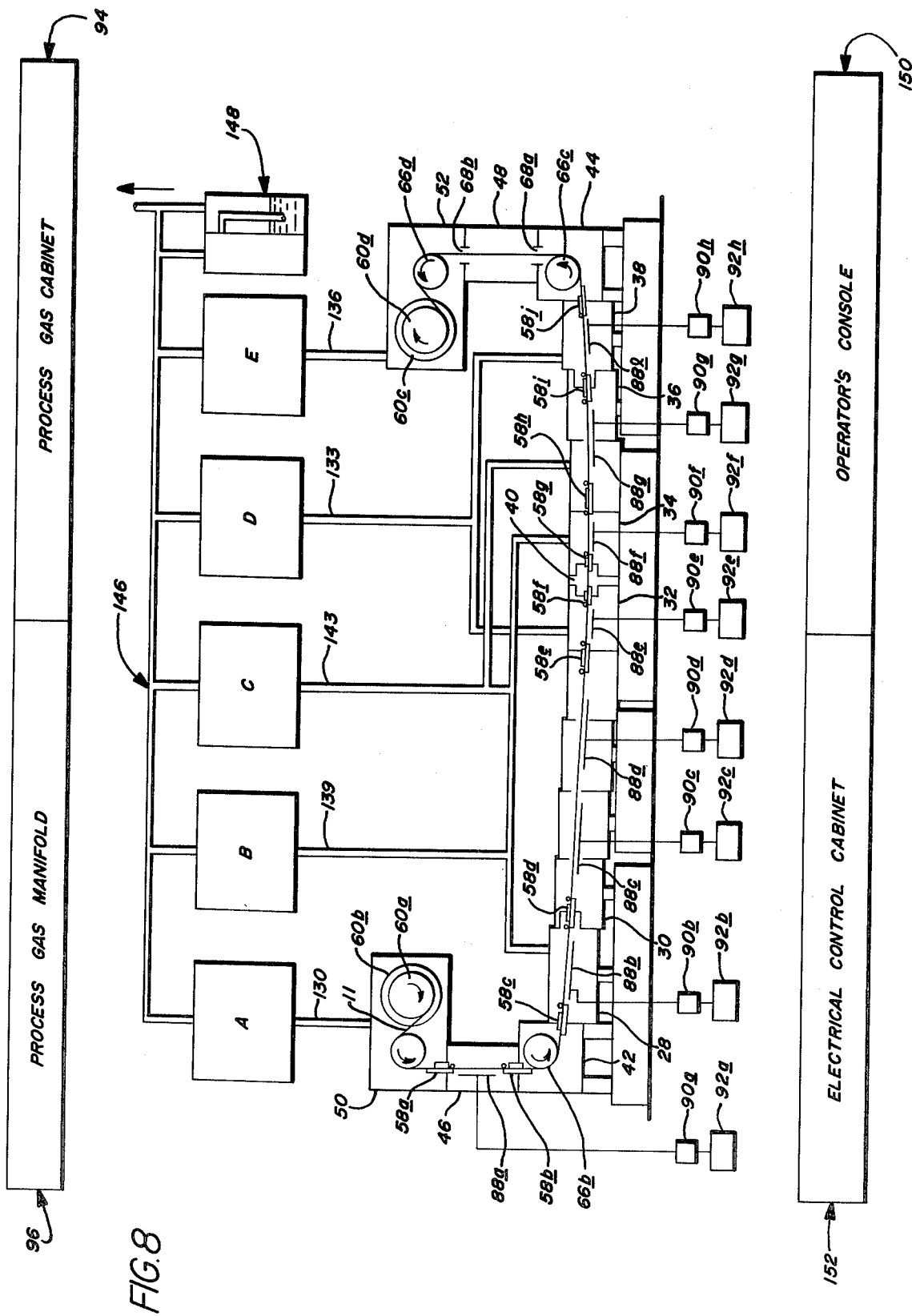
FIG. 8 is a diagrammatic representation of the multiple chamber deposition apparatus of the present invention showing the isolation mechanisms, the substrate stretching from the supply chamber to the take-up chamber, the cathodes and power generation equipment, the pumping systems for exhausting noxious reaction gas mixtures from the chambers, the process gas cabinet for storing the reaction gas cylinders, the process gas manifold for mixing and introducing reaction gases into the chambers, and the cabinetry in which the electrical controls are housed.

In the preferred embodiment, and as shown in FIGS. 6 and 8, a process gas cabinet 94 is placed behind the apparatus 26, and to the left of the process gas cabinet 94 is a process gas manifold 96. The process gas cabinet 94 houses pressurized tanks or cylinders filled with the reaction gases adapted to be mixed and introduced into the chambers of the deposition apparatus 26. More particularly, hydrogen gas is provided in cylinder 94a, methane is provided in cylinder 94b, germanium tetrafluoride gas is provided in cylinder 94c, germane gas is provided in cylinder 94d, silane gas is provided in cylinder 94e, silicone tetrafluoride gas is provided in cylinder 94f, phosphine gas is provided in cylinder 94g and diborine gas is provided in cylinder 94h. Additionally, at least one cylinder of argon gas 94i is provided outside of the process gas cabinet 94. The process gas manifold 96 includes a plurality of compartments into which preselected proportions of the reaction gases stored in the cylinders 94a–94i are introduced to be subsequently fed into respective chambers of deposition apparatus 26. Accordingly, the preselected reaction gases, described hereinabove, are introduced into a cleaning compartment 96a in the process gas manifold 96 which corresponds to the cleaning chamber 46 of the apparatus 26; the preselected reaction gases are introduced into a $P_1$ compartment 96b in the process gas manifold 96 which corresponds to the first deposition chamber 28; the preselected reaction gases are introduced into an $I_1$ compartment 96c in the process gas manifold 96 which corresponds to the second deposition chamber 30; the preselected reaction gases are introduced into an $N_1$ compartment 96d in the process gas manifold 96 which corresponds to the third deposition chamber 32; the preselected reaction gases are introduced into an isolation compartment 96e in the process gas manifold 96 which corresponds to the isolation chamber 40; the preselected reaction gases are introduced into a $P_2$ compartment 96f in the process gas manifold 96 which corresponds to the fourth deposition chamber 34; the preselected reaction gases are introduced into an $I_2$ compartment 96g in the process gas manifold 96 which corresponds to the fifth deposition chamber 36; and the preselected reaction gases are introduced into the $N_2$ compartment 96h in the process gas manifold 96 which corresponds to the sixth deposition chamber 38.

As becomes readily apparent from viewing the mixing lines leading from the gas cylinders 94a–94h into the mixing compartments 96a–96h, argon is fed from the argon cylinder 94i through conduit 98a to: the cleaning compartment 96a via line 98b; the $P_1$ compartment 96b via line 98c; the $I_1$ compartment 96c via line 98d; to the $N_1$ compartment 96d via line 98e; the isolation compartment 96e via the line 98f; the $P_2$ compartment 96f via line 98g; the $I_2$ compartments 96g via the line 98; and the N$_2$ compartment 96h via the line 98i. The diborone gas is fed from the cylinder 94h through conduit 100a to: line 100b wherein it is introduced into the P$_1$ compartment 96b; and line 100c from which it is introduced to the P$_2$ compartment 96f. The phosphine gas is fed from the cylinder 94g through conduit 102a to: line 102b from which it is introduced into the N$_1$ compartment 96d; and line 102c from which it is introduced into the N$_2$ compartment 96h. The silicon tetrafluoride gas is fed from the cylinder 94f through conduit 104a to: line 104b from which it is introduced into the I$_1$ compartment 96c; line 104c from which it is introduced into the isolation compartment 96e; and line 104d from which it is introduced to the I$_2$ compartment 96g. The silane gas is fed from the cylinder 94e through conduit 106a: to line 106b from which it is introduced into the I$_1$ compartment 96c; to line 106c from which it is introduced into the isolation compartment 96e; and to line 106d from which it is introduced into I$_2$ compartment 96g. The germane gas is fed from the cylinder 94d through conduit 108a to line 108b from which it is introduced into the I$_1$ chamber 96c. The germanium tetrafluoride gas is fed from the cylinder 94c through conduit 110a to line 110b from which it is introduced into the I$_1$ compartment 96c. The methane gas is fed from the cylinder 94b through conduit 112a from which it is introduced into: the P$_1$ compartment 96b via line 112b; the N$_1$ compartment 96d via line 112c; the P$_2$ compartment 96f via the line 112d; and the N$_2$ compartment 96h via the line 112e. Finally, the hydrogen gas is fed from the cylinder 94a through conduit 114a to: the line 114b from which it is introduced into the cleaning compartment 96a; the line 114c from which it is introduced into the I$_1$ compartment 96c; the line 114d from which it is introduced into the isolation compartment 96e; the line 114e from which it is introduced into the I$_2$ compartment 96g; and the line 114b from which it is introduced into the post-deposition, substrate-directing chamber 44. While conduits for germane and germanium tetrafluoride have been described as leading only into the I$_1$ compartment 96c, it would be necessary to also provide conduits for channeling those gases into the isolation compartment 96e and the I$_2$ compartment 96g if an amorphous germanium semiconductor alloy material rather than a silicon semiconductor alloy material was employed. Since the preferred embodiment of the present invention is an amorphous silicon semiconductor alloy material, the silane and silicon tetrafluoride gas lines have been shown feeding these gases into the isolation compartment 96e and the I$_2$ compartment 96g as well as the I$_1$ compartment 96c.

Figure 6A:
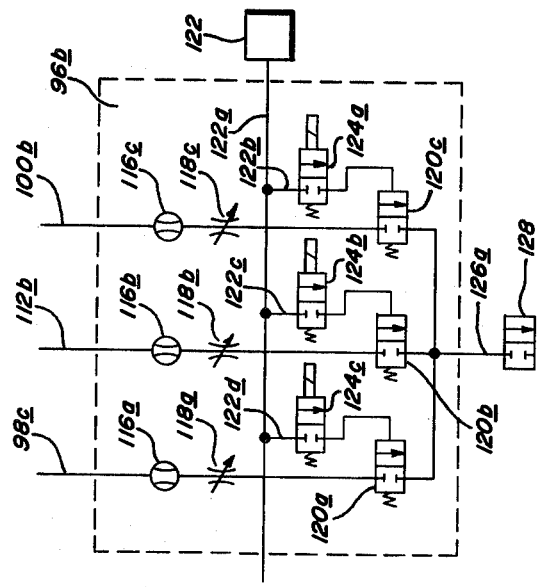
FIG. 6A is an enlarged diagrammatic representation of the general valving system common to all of the compartments of the process gas manifolds illustrated in FIG. 6.

FIG. 6A is a schematic illustration of the general valving system common to all of the compartments in the process gas manifold 96. In the specific embodiment shown in FIG. 6A, three reaction gases from the reaction gas cylinders 94a–94i in the process gas cabinet 94 are fed into one of the compartments of the process gas manifold for mixing therein. The same type of valving arrangement is employed for the other compartments 96a–96h of the process gas manifold by adding or substracting feed lines and the corresponding valving from those shown in FIG. 6A. More particularly, the valving system for the isolation compartment 96e would include four feed lines for introducing four reaction gases thereinto and four corresponding valving arrangements; rather than the three feed lines and three valving arrangements for introducing three reaction gases into compartment 96b illustrated in FIG. 6A.

For purposes of illustrating the operation of the valving arrangements, the introduction of three reaction gases into the P$_1$ compartment 96b will be described in detail. In the P$_1$ compartment 96b, argon gas is introduced via line 98c, methane gas is introduced via line 112b and diborone gas is introduced via line 100b. The box 122 represents a blower for introducing oiled and filtered shop air into the chambers of the apparatus 26. The blower 122 is constantly operating to provide an input into a solenoid control valve 122a which is connected to an on-off valve 120c, a solenoid valve 124b which is connected to an on-off valve 120b and a solenoid 124c which is connected to an on-off valve 120a. The solenoid valves 124 normally operate to prevent the flow of reaction gases into the chambers of the deposition apparatus 26. However, upon receiving an electrical signal, the solenoid valves 124 are adapted to open the on-off valves 120 for initiating the mixture of reaction gases fed by lines 98c, 112b and 100b through the chamber-introducing feed line 126a to the P$_1$ deposition chamber 28 of the deposition apparatus 26. An additional on-off valve 128 is provided adjacent the first deposition chamber 28 to open and close the flow of reaction gases to and from the chamber during vacuumizing and devacuumizing operations. The actual mixing of the reaction gases from the cylinders 94a–94i of the process gas cabinet is accomplished by setting the metering valves 116 and the on-off valves 118. Therefore, the flow of argon gas introduced into the compartment 96b of FIG. 6A is controlled by metering valve 116a and on-off valve 118a; the flow of methane gas is controlled by metering valve 116b and on-off valve 118b and the diborone gas is proportioned by metering valve 116c and on-off valve 118c. The metered argon, methane and diborone gases are then mixed together when the apparatus is in its operating mode, in feed line 126a, for introduction into the first deposition chamber 28.

In a like manner, reaction gases from the cylinders 94a–94i of the process gas cabinet are proportioned by the metering valves and shut-off valves in the compartments 96a–96h of the process gas manifold and then introduced through feed lines 126a–126g to the chambers of the deposition apparatus 26. More specifically, metered and mixed reaction gases are fed from the I$_1$ compartment 96c in the process gas manifold through feed line 126b to the second deposition chamber 30; metered and mixed reaction gases are fed from the N$_1$ compartment 96d in the process gas manifold through feed line 126c to the third deposition chamber 32; metered and mixed reaction gases are fed from the isolation compartment 96e in the process gas manifold through feed line 126d to the fourth deposition chamber 34; metered and mixed reaction gases are fed from the P$_2$ compartment 96f in the process gas manifold through the feed line 126e to the fourth deposition chamber 34; metered and mixed reaction gases are fed from the I$_2$ compartment 96g in the process gas manifold through the feed line 126f to the fifth deposition chamber 36; and metered and mixed reaction gases are fed from the N$_2$ compartment 96h in the process gas manifold compartment through the feed line 126g to the sixth deposition chamber 38. Additionally, metered and mixed reaction gases from the cleaning compartment 96a in the process gas manifold are fed through line 126h into the substrate cleaning chamber 46. Finally, a further tank or cylinder of argon gas 94j is operatively connected via line 128 for introduction into the pay-off, substrate-directing chamber 42, the first deposition chamber 28, the second deposition chamber 30, the third deposition chamber 32, the isolation chamber 50, the fourth deposition chamber 34, the fifth deposition chamber 36, the sixth deposition chamber 38 and the post-deposition, substrate-directing chamber 44.

The reaction gases are delivered from the process gas manifold to the chambers of the apparatus 26 at a flow rate which provides: (1) the desired flow of the gases through the passageways 80 in the gas gates 58 to sustain the plasmas in the chambers of the apparatus 26; (2) the required isolation from diffusion of the dopant reaction gas mixtures introduced into the first deposition chamber 28 and the third deposition chamber 32 into the intrinsic deposition chamber 30; (3) the required isolation from diffusion of the dopant reaction gas mixtures introduced into the fourth deposition chamber 34 and sixth deposition chamber 38 from the intrinsic deposition chamber 36; and (4) the required isolation from diffusion of the dopant reaction gas mixtures introduced into the third deposition chamber 32 from the dopant reaction gas mixtures introduced into the fourth deposition chamber 34 and the dopant reaction gas mixtures introduced into the third deposition chamber 32. Also, the rate of introduction of reaction gas must not only be sufficient to sustain the plasmas in the chambers, but must also provide a concentration ratio of the dopant reaction gases to the intrinsic reaction gases of about $10^{-3}$. By maintaining that ratio, the purity of the intrinsic amorphous alloy in the intrinsic deposition chamber will be maintained in a satisfactory range.

In order to insure the desired flow of reaction gases from chamber to chamber and thereby insure the proper isolation of reaction gases between chambers it is desirable to maintain the pressure in the first deposition chamber 28, the third deposition chamber 32, the fourth deposition chamber 34, and the sixth deposition chamber 38 at about 0.55 torr and the pressure in the pay-off, substrate-directing chamber 46, the post-deposition, substrate-directing chamber, the second deposition chamber 30, and the fifth deposition chamber 36 at about 0.6 torr. It should be apparent that the flow rate of the reaction gases entering the chambers of the apparatus 26 are adapted to operate in conjunction with the flow rate of reaction gases removed from the chambers to produce the desired vacuumized pressure and the pressure differentials, described hereinabove. The pumping systems for removing reaction gases from the chambers and isolating reaction gases in adjacent chambers will be discussed in detail in the section which follows. For purposes of illustration, it has been found that a flow rate within a range of 200–600 SCCM, accomplishes the purposes outlined above.

L. Achieving Isolation at Selected Vacuum Pressures

Figure 7:
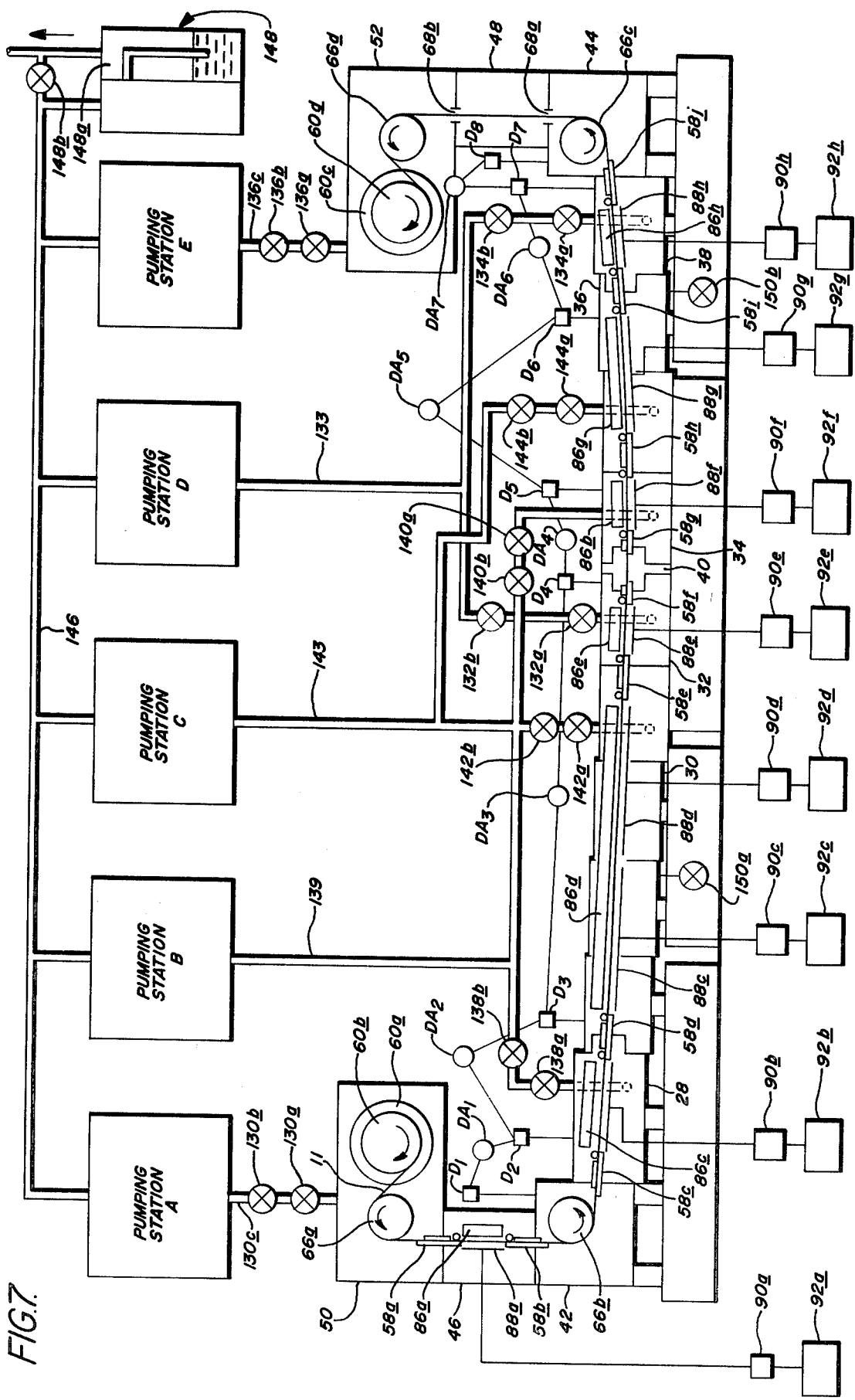
FIG. 7 is a diagrammatic representation of the multiple chambers which combine to form the apparatus of the present invention showing the isolation mechanisms, the substrate stretching from the supply chamber to the take-up chamber, the heating elements, the cathodes and power generation equipment therefor, and the pumping stations for exhausting noxious reaction gas mixtures from the chambers.

FIG. 7 is a diagrammatic representation of the multiple chambers which combine to form the glow discharge deposition apparatus 26 of the present invention and showing, as described hereinabove: the gas gates 58a–58j; the substrate extending from the supply core 60a on the supply mandril 60b to the take-up core 60c on the take-up mandril 60d; the idler rollers 66a, 66b, 66c and 66d adapted to change the direction of travel of the substrate 11; the holders for the heating elements 86a–86h, and the cathodes 88a–88h connected to power supplies 92a–92h which are regulated by tuners 90a–90h. Further, and as described hereinafter, FIG. 7 adds, diagrammatically, (1) the pumping stations A–E which are adapted to exhaust the reaction gas mixtures from the chambers of the deposition apparatus 26; and (2) a scrubber 148 for purifying noxious exhaust gas mixtures prior to venting to atmosphere.

More particularly, five pumping stations A–E are provided. The first pumping station A is operatively connected and adapted to direct exhaust gases from the supply chamber 50 of the apparatus 26 through a variable orifice valve 130a, an on-off valve 130b and a line 130c into the pumping station A. The second pumping station B is operatively connected and adapted to direct exhaust gases from the first and fourth deposition chambers 28 and 34, through variable orifice valves 138a and 140a, respectively, on-off valves 138b and 140b and line 139, into the pumping stations B. The third pumping station C is operatively connected and adapted to direct exhaust gases from the second and fifth deposition chambers 30 and 32, through variable orifice valves 142a and 144a, respectively, on-off valves 142b and 144b, respectively, and line 143, into the pumping station C. The pumping station D is operatively connected and adapted to direct exhaust gases from the third and sixth deposition chambers 32 and 38, through variable orifice valves 132a and 134a, respectively, on-off valves 132b and 134b, respectively, and line 133, into the pumping station D. Finally, the pumping station E is operatively connected and adapted to direct exhaust gases from the take-up chamber 52, through a variable orifice valve 136a, on-off valve 136b, and a line 136c, into the pumping station E.

Each of the pumping stations A–E includes filters, at least one blower for initial reduction of the pressure within the chambers of the apparatus 26, and at least one pump connected in series with the blower to reduce the vacuum pressure in the chambers to the desired level of approximately 0.5 torr.

For example, in one embodiment of the invention, pumping stations A, D, and E each comprise a blower capable of pumping 330 c.f.m. backed up with a pump capable of pumping 65 c.f.m.; pumping station B comprises a blower capable of pumping 660 c.f.m., backed up with a pump capable of pumping 65 c.f.m.; and pumping station C comprises a blower capable of pumping 1385 c.f.m. backed with two pumps in parallel, each capable of pumping 65 c.f.m.

Figure 10B:
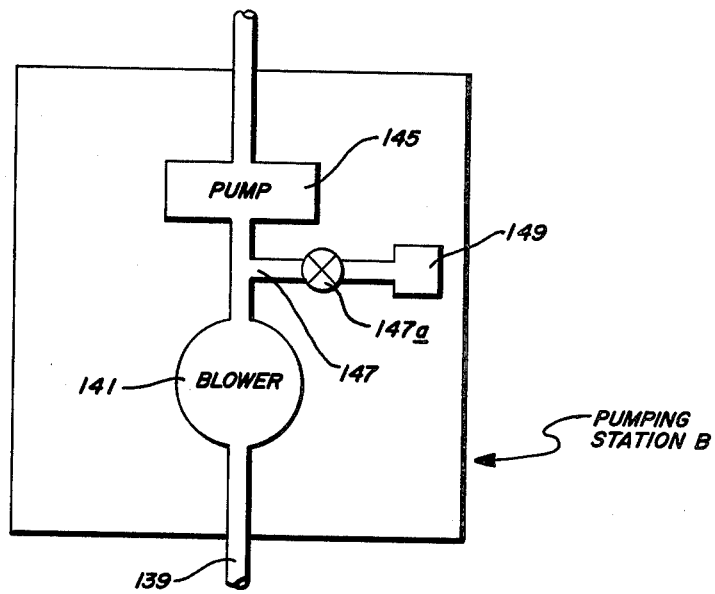
FIG. 10B is a diagrammatic representation of one of the pumping stations of the present invention showing the location of the pump, blower and leak test port.

FIG. 10B diagrammatically depicts the components of pumping station B in greater detail. The station consists of a 660 c.f.m. capacity blower 141, and a 65 c.f.m. capacity pump 145. The blower functions best if its exhaust is maintained at less than atmospheric pressure, and for this reason the pump 145 is in series with the exhaust from the blower 141. Also included in the pumping station is a leak test conduit 147 in parallel with the pump 145, and having a valve 147a for connecting it to a leak-detector 149. In operation, the blower 141 exhausts the spent reaction gas mixtures from the deposition chambers via a conduit 139 connected thereto. The pump 145 removes the gases exhausted by the blower 141 and conveys them to an exhaust conduit 146, as previously described.

After passing through the pumping stations A–E, the exhausted reaction gas mixtures are introduced into a scrubber assembly 148 through individual conduits or through a common conduit 146. The scrubber 148 is adapted to purify the noxious exhaust reaction gas mixtures drawn from the chambers prior to releasing same to the atmosphere. To this end, the noxious reaction gas mixtures are introduced into a fluid tank section 148a of the scrubber 148. The fluid therein is preferably a solution of sodium bicarbonate and water maintained at 1–2 pounds over atmospheric pressure. Obviously, other well known and commercially available purifying agents can be employed. A check valve 148b is provided in the event that it becomes necessary to shunt the noxious reaction gas mixtures directly to atmosphere.

Since it is essential, for effective deposition of device-grade semiconductor layers, that the vacuum pressures in the chambers of the apparatus 26 be maintained at preselected levels, manometers are provided to constantly monitor vacuum pressures in the chambers. More particularly, a manometer $D_1$ is operatively connected to the pay-off, substrate-directing chamber 32 for sensing the pressure therein; a manometer $D_2$ is operatively connected to the first deposition chamber 28 for sensing the pressure therein; a manometer $D_3$ is operatively connected to the second deposition chamber 30 for sensing the pressure therein; a manometer $D_4$ is operatively connected to the third deposition chamber 32 for sensing the pressure therein; a manometer $D_5$ is operatively connected to the fourth deposition chamber 34 for sensing the pressure therein; a manometer $D_6$ is operatively connected to fifth deposition chamber 36 for sensing the pressure therein; a manometer $D_7$ is operatively connected to the sixth deposition chamber 38 for sensing the pressure therein; and a manometer $D_8$ is operatively connected to the post-deposition, substrate-directing chamber 44 for sensing the pressure therein.

A differential amplifier $DA_1$ is operatively connected to manometers $D_1$ and $D_2$ for measuring the pressure differential between the pay-off substrate-directing chamber 42 and the first deposition chamber 28; a differential amplifier $DA_2$ is operatively connected to manometers $D_2$ and $D_3$ for measuring the pressure differential between the first deposition chamber 28 and the second deposition chamber 30; a differential amplifier $DA_3$ is operatively connected to manometers $D_3$ and $D_4$ for measuring the pressure differential between the second deposition chamber 30 and the third deposition chamber 32; a differential amplifier $DA_4$ is operatively connected to manometers $D_4$ and $D_5$ for measuring the pressure differential between the third deposition chamber 32 and the fourth deposition chamber 34; a differential amplifier $DA_5$ is operatively connected to manometers $D_5$ and $D_6$ for measuring the pressure differential between the fourth deposition chamber 34 and the fifth deposition chamber 36; a differential manometer $DA_6$ is operatively connected to manometers $D_6$ and $D_7$ for measuring the pressure differential betwen the fifth deposition chamber 36 and the sixth deposition chamber 38; and a differential manometer $DA_7$ is operatively connected to manometers $D_7$ and $D_8$ for measuring the pressure differential between the sixth deposition chamber 38 and the post-deposition, substrate-directing chamber 44. The differential amplifiers $DA_1$–$DA_7$ are operatively connected to electrical controls for operating the variable orifice valves 130a, 132a, 134a, 136a, 138a, 140a, 142a and 144a to insure the preselected pressure differentials between adjacent chambers of the apparatus 26 are maintained.

Finally, a vent valve 150a is connected to the second deposition chamber 30 and a vent valve 150b is connected to the fifth deposition chamber 36 to provide for the emergency exhaustion of reaction gas mixtures from the chambers of the deposition apparatus 26.

M. The Leak Test Assembly

In order to assure that the photovoltaic devices manufactured in the glow discharge deposition apparatus 26 of this invention are of the highest possible efficiency, it is necessary to prevent contamination of the semiconductor layers by extraneous debris. The gas gates 58a–58j, mentioned hereinabove, substantially prevent cross contamination of the reaction gases between adjacent deposition chambers. However, it is also necessary to assure that there is no leakage from the ambient atmosphere into the chambers. For this reason, it is necessary that the deposition apparatus 26 be tested for leaks.

There are many methods available for testing evacuated systems for leaks. Generally, these methods involve the use of a liquid or gas probe material and a detector responsive to the probe material. The detector is operatively connected to the evacuated apparatus being tested, while the probe material is dispensed about the external surfaces of the apparatus. If a leak is present, the probe material is drawn into the vacuum chamber where it is sensed by the detector. While such methods are generally applicable to the deposition apparatus 26 of this invention, difficulties arise, in particularly adapting those methods to the multiple, interconnected, elongated chambers involved herein. Therefore, the following method of and apparatus for leak isolation and detection has been developed for the instant invention.

It is first necessary to isolate the chamber or chambers of the deposition apparatus 26 to be tested, because the sensitivity of the detector could be adversely affected by the large volumes of the apparatus 26 or by effluents from other portions of the apparatus 26. Additionally, the presence of multiple leaks would render interpretation of the leak test results difficult. Isolation may be accomplished by removing a gas gate 58, see FIG. 10A, thereby connecting the adjoining deposition chambers, such as 28 and 30, and replacing the gas gate with a leak test asembly 288 as shown in FIG. 10.

The leak test assembly 288 is made of a rigid, durable material such as aluminum or stainless steel, and includes a first plate 290 having adjacent the outer perimeter of one of its faces, a groove 292 adapted to receive therein an elastic O-ring 292a. This first plate 290 also includes conventional fastening members such as a pair of bolts 294 and nuts 294a, for connecting the first plate 290 and a second plate 296 to the interconnection port.

The function and use of the test plate assembly 288 may best be understood by reference to FIG. 10A. Depicted therein are the adjacent ends of the two deposition chambers 28 and 30. The gas gate 58d normally connecting these chambers has been removed (and is therefore shown in phantom outline). Removal of the gas gate 58d leaves a passageway or interconnection port interconnecting the two chambers 28 and 30. This passageway is adapted to be sealed by the leak test assembly 288, which is installed so that the first plate 290 and the second plate 296 are disposed on opposite sides of the passageway opening. The O-ring 292a abuts against one side of the bulk head 28a, separating the chamber 28 from the chamber 30. The nuts 294a and bolts 294 serve to tightly fasten the plates 290 and 296 to the bulk head 28a by compressing the O-ring 292a to effectuate a vacuum-tight seal. Similar leak test assemblies may be used to further isolate the remaining chambers of the apparatus 26 for testing. In some cases, it may be sufficient to isolate a large portion of the apparatus 26 such as one comprised of three or four chambers; while in other instances it will be necessary to isolate a single chamber for leak testing.

When the chamber or chambers are properly isolated, a commercial leak detecting system, such as the model MS 170 manufactured by the Veeco Corporation, may be used. This system and other similar testing systems manufactured by other corporations are essentially mass-spectrometers specifically tuned to detect helium. In operation, the leak tester 149 is operatively connected to the exhaust line of the isolated vacuum chamber or chambers via the leak test conduit 147 and its associated valve 147a as depicted in FIG. 10B. The leak tester is thereby placed in series with the blower 141 of the pumping station. Therefore, any gases exiting from the vacuum chamber will pass through the blower 141 and a percentage thereof will flow into the leak detector 149. Helium gas is dispensed about the external surface of the deposition apparatus 26 being tested for leaks. If a leak is present, the helium will be drawn into the chamber, exhausted by the blower 141 to the leak test conduit 147, and sensed by the leak detector. If a large number of leaks are present, it may be necessary to reduce the number of chambers being tested so that the location of each leak can be precisely ascertained.

It is to be understood that the disclosed method of isolation and leak detection need not be used solely with the helium leak detector as described, but may be used in conjunction with any method of leak detection where it is desirable to isolate a portion of the apparatus 26.

N. The Electrical Stations

FIG. 8 is a diagrammatic representation of the multiple chambers which combine to form the glow discharge deposition apparatus 26 of the present invention showing, as described hereinabove: the gas gates 58a-58i; the substrate extending from the supply core 60a on the supply mandril 60b to the take-up core 60c on the take-up mandril 60d; the idler rollers 66a, 66b, 66c and 66d adapted to change the direction of travel of the substrate 11; the cathodes 88a-88i with the associated power supplies 92a-92h controlled by tuners 90a-90h; the pumping systems A-E for exhausting noxious reaction gas mixtures from the chambers to a scrubber 148; the process gas cabinet for storing the reaction gas cylinders 94a-94i; and the process gas manifold for mixing reaction gases and introducing the mixed reaction gases into the chambers of the apparatus 26. FIG. 8 adds, in black box form, an operator's console 150 and an electrical control cabinet 152.

The operator's control console 150 includes drive motor controls; automatic threader controls; interleaf controls, substrate speed indicators and controls; substrate tension indicators and controls; radio frequency generator controls; alloy layer thickness monitors; and controls spectrometer controls; vacuum pressure controls; reaction gas flow controls; reaction gas mixing controls; and on-off switches.

The electrical control cabinet 152 includes a main disconnect switch, fuses, transformers, heater controls, motor starters, and sequence interlock controls. It is unnecessary to detail the circuitry for connecting the controls housed in the operator's console 150 and the electrical control cabinet 152 to the mechanisms for monitoring, indicating and controlling the operation of the assembly 26. Such electrical controls are well within the ability of the ordinarily skilled artisan and in and of themselves are insignificant to the operation the present invention.

O. The Internal Deposition Chamber Configuration

Referring now to FIG. 11, there is illustrated, in cross-section, one deposition chamber, such as 28, of the deposition apparatus 26 of the present invention. The deposition chamber 28 includes a top wall 28a, a bottom wall 28b, side walls 28c, an inlet reaction gas manifold system 29, a shield 31 for confining reaction gases to the plasma region, the cathode 88, a reaction gas exit port 33, an elongated ceramic bar magnet 35 and a removable powder trap 37.

More particularly, the inlet gas manifold system comprises an aperatured, elongated, supply conduit 29a adapted to introduce a reaction gas mixture into the deposition chamber 28, a plurality of staggered, spaced, generally vertical, baffle plates 29b for mixing and reducing the turbulence of the incoming reaction gases prior to the time in which the reaction gases contact the cathode 88, and a horizontal manifold wall 29c adapted to complete the manifold enclosure and provide a shoulder which, along with horizontal shield wall 31a, supports the bar magnet 35.

The powder trap 37 is removably secured below and downstream of the flow of the reaction gas mixture relative to the cathode. By so positioning the powder trap 37, it is adapted to capture post-deposition powder on the baffle plates 37a thereof. Specifically, the trap 37 includes a top wall 37a adapted to removably abut the underside of the cathode 88, a bottom wall 37b adapted to removably abut the bottom wall of the deposition chamber 28, oppositely disposed side walls 37c, and the plurality of spaced, staggered, generally horizontally disposed baffle plates 37d adapted to provide a tortuous path of travel for the spent reaction gas mixture.

The path of travel of the reaction gas mixture through the deposition chamber 28 is depicted by the reference letter A in FIG. 11. Note that the reaction gas mixture (1) enters the deposition chamber via the apertures spaced along the length of supply conduit 29a, (2) is mixed and reduced to a substantially laminar rate of flow in the inlet reaction gas manifold system 29, (3) becomes an ionized plasma as it passes between the cathode 88 and the substrate 11, (4) flows about and around the edge of the cathode plate 88, (5) passes through the baffle plates 37d of the powder trap 37, and (6) exits from the deposition chamber 28 via the exit port 33. As the heated reaction gases contact the baffle plates 37d of the powder trap, powder such as silane dust is formed and collects thereon, rather than migrating about and settling onto the walls of the deposition chamber 28. In this manner, periodic cleaning of the deposition chamber 28 and apparatus therein is greatly facilitated. Upon opening the chamber, following completion of the deposition process for a thousand foot length of substrate material, the powder trap 37 may be readily removed from the chamber and replaced by a clean trap. In this manner, the clean-up procedure is simplified so as to (1) reduce the down time of the deposition apparatus, and (2) minimize the amount of powder collected on the interior walls of the chamber.

III. The Operational Sequence

The operation of the apparatus 26 comprising all of the chambers and all of the assemblies, described hereinabove in the description of FIGS. 2-12, necessary to effectuate the continuous production of stacked, amorphous, photovoltaic cells on a continuous web of substrate material 11 may include the performance of at least some of the following steps:

(1) The core 60a about which the web of substrate material 11 is wound, is loaded onto the expandable pay-off mandril 60b housed within the pay-off chamber 50 of the glow discharge deposition apparatus 26;

(2) The core of substrate 60a is centered on the pay-off mandril 60b and locked in place thereon by expanding the circumference of pay-off mandril 60b;

(3) The leading edge of the web of substrate material 11 is wound about the links 62n, 62p and 62q of the flexible belt 62g of the automatic threading assembly 62;

(4) The automatic threading assembly 62 is energized by activating the motor 62a positioned adjacent the pay-off mandril 60b and the motor 62d positioned adjacent the pick-up mandril 60d. The substrate 11 is thereby threaded about idler rollers 66a and 66b, through the passageways 80 in the gas gates 58a–58j; about idler rollers 66c and 66d, through slots 68a and 68b to the take-up roller 62f located adjacent the take-up mandril 60d in the take-up chamber 52. The strip is detached from the flexible belt 62d of the automatic threading assembly 60 and taped to the empty core 60c which is locked in a centered position on the take-up mandril 60d;

(5) The optional interleaf removal and take-up assembly 64 is implemented by securing the interleaf sheeting 64d from between adjacent layers of the fresh substrate core 60a on the supply mandril 60b to the interleaf removal roller 64a positioned adjacent the supply mandril 60b in the pay-off chamber 50. The replacement interleaf sheeting 64d wound about the interleaf introduction roller 64e is secured to the substrate 11 on the take-up core 60c centered on the take-up mandril 60d in the take-up chamber 52 for introducing interleaf sheeting 64d between adjacent layers of substrate 11 as the substrate 11 is wound about the take-up core 60c;

(6) All of the chambers of the apparatus 26 are sealed in preparation for vacuum pumping;

(7) The pumping systems A–E are activated to begin vacuumizing the apparatus 26 to the desired vacuum pressures;

(8) All of the heating elements, both the resistance heaters 84 in the gas gates 58a–58j and the holders for the heating elements, such as infrared lights, 86a–86h in the chambers of the deposition apparatus 26 are energized during the vacuumizing operation, but only after the pumping systems A–E have been activated;

(9) Argon gas from container 94j is introduced into all of the chambers of the apparatus 26 to flush same;

(10) The argon and hydrogen gases are mixed and the flow rate thereof is set for cleaning the plasma in the cleaning chamber 46. The proportion of reaction gas mixtures and gas flow rates are set for mixing and introducing the reaction gas mixtures into the first deposition chamber 28, the second deposition chamber 30, the third deposition chamber 32, the intermediate isolation chamber 40, the fourth deposition chamber 34, the fifth deposition chamber 36, the sixth deposition chamber 38, and the post-deposition, substrate-directing chamber 44;

(11) The radio frequency power supplies 92a–92h are energized and the tuners 90a–90h thereof are set to activate the cathodes 88a–88h at the desired power levels;

(12) The substrate supply and take-up assembly 60 is activated by energizing the supply drive motor 60g, the substrate-tensioning motor 66g, the take-up idler motor 66a and the take-up drive motor 60e;

(13) The assembly 26 will begin processing the web of substrate material 11 at a rate of approximately one (1) foot per minute, to automatically and continuously deposit successive layers of amorphous silicon semiconductor alloys thereonto by setting the temperature controllers 88, the speed controllers 60, the tension controllers 66, the radio frequency tuners 90 to maintain preset operating parameters;

(14) When the end of the web of substrate material 11 has been reached, the substrate unload cycle is activated;

(15) The pay-off mandril 60d about which the core of substrate 60a is centered is stopped;

(16) The introduction of reaction gas mixtures is halted; argon gas is introduced into all of the chambers of the deposition apparatus 26 from the argon gas cylinder 94j to flush the chambers, starting simultaneously in the second deposition chamber 30, the fifth deposition chamber 36 and the intermediate isolation chamber 40. The argon gas is subsequently introduced into all of the other chambers while maintaining the pressure differentials therebetween so as to prevent the flow of the p-type dopant and n-type dopant into the intrinsic deposition chambers;

(17) The resistance heaters 84 in the gas gates 58a–58j, the holders for the heating elements 86a–86h in the chambers of the deposition apparatus 26, and the pumping systems A–E are disabled;

(18) The vent valves 150a–150b are energized and the web of substrate material 11 is forwarded to complete winding of same about the take-up core 60c on the take-up mandril 60d in the take-up chamber 52;

(19) The chambers of the apparatus 26 are opened to the environment;

(20) The circumference of the take-up mandril 60d and the supply mandril 60b are relaxed and the take-up core 60c and the supply core 60a are removed therefrom;

(21) The filters are checked and cleaned; and

(22) A fresh core 60a of substrate 11 is centered onto the pay-off mandril 60b.

Note that the foregoing summary of the sequential steps employed to operate the glow discharge deposition apparatus of the present invention are merely exemplary. Various modifications, alterations, additions and deletions therefrom may be made without deviating from the spirit and scope of the present invention.

While for purposes of illustration, a preferred embodiment of this invention has been disclosed, other forms and embodiments thereof may become readily apparent to those ordinarily skilled in the art upon reference to this disclosure and, therefore, this invention is intended to be limited only by the scope of the appended claims.

What we claim for U.S. Letters Patent is:

1. A method of continuously producing tandem, amorphous photovoltaic cells on an elongated web of substrate material which is adapted to continuously move from a pay-off mandril through a substrate cleaning chamber and a series of at least two triads of isolated deposition chambers to a take-up mandril; sources of reaction gases including at least precursor semiconductor material; means for introducing reaction gas mixtures into each deposition chamber for disassociation and deposition of successive noncrystalline semiconductor layers of varying conductivity onto the web of substrate material passing therethrough; the method comprising the steps of:

automatically threading the web of substrate material so as to deliver and secure the leading edge thereof from the pay-off mandril to the take-up mandril;

attaching the leading edge of replacement interleaf sheeting from a replacement interleaf core to the substrate material prior to winding the substrate material about the take-up mandril, whereby the interleaf sheeting is positioned between adjacent layers of substrate material as the substrate material is wound about the take-up mandril;

sealing and vacuumizing the chambers through which the substrate material passes;

flushing the chambers;

heating the deposition chambers to warm the substrate material and the reaction gas mixtures to deposition temperatures;

providing a gas gate between each pair of adjacent deposition chambers of each triad;

providing a source of sweep gas;

introducing the sweep gas into each of the gas gates;

providing sources of reaction gases;

setting mixtures of reaction gases and introducing the preset reaction gas mixtures into the deposition chambers, the flow of reaction gas mixtures and the flow of sweep gas adapted to substantially prevent cross-contaminating of the process gas mixtures in adjacent deposition chambers;

providing sources of cleansing gases;

setting a flow of cleansing gases into a substrate cleaning chamber;

the step of setting and introducing the reaction gas mixtures further comprising: (1) setting a flow of semiconductor precursor gases and a dopant gas from the sources into the first deposition chamber of each triad; (2) setting a flow of semiconductor precursor gases and a dopant gas of opposite conductivity from the sources into the third deposition chamber of each triad; and (3) setting a flow of semiconductor precursor gases into the second deposition chamber of each triad;

providing sources of isolation gases;

providing a discrete isolation chamber between the third deposition chamber of the first triad and the first deposition chamber of the second triad; setting an isolation gas mixture from the sources and introducing the preset isolation gas mixture into the discrete isolation chamber; directing the isolation gas mixture to unidirectionally flow from the discrete isolation chamber into the third chamber of the first triad and the first chamber of the second triad;

energizing the means for disassociating and depositing the reaction gas mixtures onto the substrate material;

starting the means for continuously moving the substrate material through the deposition chambers; and substantially maintaining the preset substrate temperature, speed of substrate travel, substrate tension, mixtures of reaction gases in each deposition chamber, mixtures of isolation gases in the isolation chamber, sweep gas in the gas gates, pressure differentials between adjacent chambers, and vacuum pressures; whereby, high quality tandem photovoltaic cells may be continuously produced.

2. A method as in claim 1, including the performance of the following steps upon completion of the deposition process:

stopping the means for continuously moving the substrate material through the deposition chambers;

disabling the flow of the reaction gas mixtures into the chambers;

flushing the chambers of the machine with argon, starting simultaneously in the second deposition chamber of each triad, while maintaining the pressure differential between adjacent chambers to insure the selected flow of the gas mixtures from the chambers;

disabling the heating elements; and disabling the operation of the pumping station.

* * * * *